US012793946B2

(12) United States Patent
Ishikawa et al.

(10) Patent No.: US 12,793,946 B2
(45) Date of Patent: Nov. 10, 2026

(54) WAFER PLACEMENT TABLE

(71) Applicant: NGK INSULATORS, LTD., Nagoya-City (JP)

(72) Inventors: Masaki Ishikawa, Handa-City (JP); Tatsuya Kuno, Nagoya-City (JP); Taro Usami, Ginan-Town (JP); Natsuki Hirata, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 102 days.

(21) Appl. No.: 19/032,655

(22) Filed: Jan. 21, 2025

(65) Prior Publication Data

US 2025/0299935 A1 Sep. 25, 2025

(30) Foreign Application Priority Data

Mar. 25, 2024 (WO) .................. PCT/JP2024/011681
Oct. 17, 2024 (JP) .................................. 2024-181488

(51) Int. Cl.
*H01J 37/32* (2006.01)

(52) U.S. Cl.
CPC ... *H01J 37/32724* (2013.01); *H01J 2237/002* (2013.01); *H01J 2237/006* (2013.01); *H01J 2237/0206* (2013.01)

(58) Field of Classification Search
CPC ........... H01J 37/32724; H01J 2237/002; H01J 2237/006; H01J 2237/0206
See application file for complete search history.

(56) References Cited

U.S. PATENT DOCUMENTS 9,240,340 B2 * 1/2016 Shiraiwa ............... H10P 72/722
2012/0309237 A1 * 12/2012 Marzano .................. H01G 4/35 29/874

(Continued)

FOREIGN PATENT DOCUMENTS

JP 2020-072262 A 5/2020
JP 2020-150256 A 9/2020

(Continued)

OTHER PUBLICATIONS

International Search Report and Written Opinion (Application No.

*Primary Examiner* — Travis Ruby
(74) *Attorney, Agent, or Firm* — Muncy, Geissler, Olds & Lowe, P.C.

(57) ABSTRACT

A wafer placement table includes a ceramic plate; an electrically conductive plate joined to a bottom surface of the ceramic plate; a ceramic plate penetrating part extending through the ceramic plate; an electrically insulating gas passage plug provided at the ceramic plate penetrating part; a gas introduction passage provided at least inside the electrically conductive plate; and an electrically conductive gas passage part provided in the gas introduction passage, the electrically conductive gas passage part being in contact with a bottom surface of the electrically insulating gas passage plug, the electrically conductive gas passage part being electrically continuous with the electrically conductive plate, the electrically conductive gas passage part allowing gas to pass between the electrically insulating gas passage plug and the gas introduction passage, wherein the electrically conductive gas passage part has a plate spring that presses the electrically insulating gas passage plug upward with elastic force.

13 Claims, 16 Drawing Sheets

(56) References Cited

U.S. PATENT DOCUMENTS

| | | | | |
|---|---|---|---|---|
| 2020/0135529 | A1 | 4/2020 | Shiraishi et al. | |
| 2020/0227291 | A1 | 7/2020 | Ishikawa et al. | |
| 2020/0286769 | A1 | 9/2020 | Shiraishi et al. | |
| 2020/0312684 | A1* | 10/2020 | Mine | H05B 3/283 |
| 2020/0411357 | A1* | 12/2020 | Kunita | H02N 13/00 |
| 2021/0274599 | A1* | 9/2021 | Uematsu | H02N 13/00 |
| 2022/0216086 | A1 | 7/2022 | Ishikawa et al. | |
| 2022/0345054 | A1 | 10/2022 | Kobayashi et al. | |
| 2023/0061208 | A1 | 3/2023 | Sasaki et al. | |
| 2023/0068968 | A1 | 3/2023 | Sasaki et al. | |
| 2023/0123870 | A1* | 4/2023 | Takebayashi | H01J 37/32724 361/234 |
| 2023/0162954 | A1* | 5/2023 | Johanson | H01J 37/32724 361/234 |
| 2023/0178344 | A1* | 6/2023 | Drewery | H01J 37/32724 156/345.51 |
| 2023/0317432 | A1 | 10/2023 | Kuno et al. | |
| 2026/0005056 | A1* | 1/2026 | Goel | H01J 37/32724 |

FOREIGN PATENT DOCUMENTS

| | | | |
|---|---|---|---|
| JP | 2022-106181 | A | 7/2022 |
| JP | 7149914 | B2 | 10/2022 |
| JP | 2022-167481 | A | 11/2022 |
| JP | 2023-006679 | A | 1/2023 |
| JP | 2023-035855 | A | 3/2023 |
| JP | 2023-035856 | A | 3/2023 |
| JP | 2023-149660 | A | 10/2023 |

* cited by examiner

WAFER PLACEMENT TABLE

BACKGROUND OF THE INVENTION

1. Field of the Invention

The present invention relates to a wafer placement table.

2. Description of the Related Art

Hitherto, there is known a wafer placement table that includes a ceramic plate having a wafer placement surface on its top surface and a base plate joined to a bottom surface of the ceramic plate and having a gas introduction passage. In PTL 1, in the thus configured wafer placement table, an electrically insulating first porous portion disposed in a through-hole of the ceramic plate, and an electrically insulating second porous portion fitted to a recess provided on a ceramic plate side of the base plate so as to be opposed to the first porous portion are provided. Gas supplied to the gas introduction passage passes through the second porous portion and the first porous portion and flows into the space between the wafer placement surface and a wafer. The gas is used to cool an object. In the description, with the first porous portion and the second porous portion, while the flow rate of gas from the gas introduction passage to the wafer placement surface is ensured, it is possible to suppress occurrence of discharge (arc discharge) due to plasma at the time when a wafer is processed.

CITATION LIST

Patent Literature

PTL 1: JP 2020-72262 A1

SUMMARY OF THE INVENTION

However, even with the electrically insulating second porous portion as described in PTL 1, there has been a case where discharge occurs around a base plate-side end of the first porous portion.

The present invention is made to solve such inconvenience, and it is a main object to suppress discharge around an electrically conductive plate-side end of an electrically insulating gas passage plug.

The present invention employs the following manner to achieve the above-described main object.

[1] A wafer placement table of the present invention includes: a ceramic plate having a wafer placement surface on its top surface and incorporating an electrode; an electrically conductive plate joined to a bottom surface of the ceramic plate; a ceramic plate penetrating part extending through the ceramic plate; an electrically insulating gas passage plug provided at the ceramic plate penetrating part, and allowing gas to pass through the interior; a gas introduction passage provided at least inside the electrically conductive plate, the gas introduction passage communicating with the ceramic plate penetrating part; and an electrically conductive gas passage part provided in the gas introduction passage, the electrically conductive gas passage part being in contact with a bottom surface of the electrically insulating gas passage plug, the electrically conductive gas passage part being electrically continuous with the electrically conductive plate, the electrically conductive gas passage part allowing gas to pass between the electrically insulating gas passage plug and the gas introduction passage, wherein the electrically conductive gas passage part has a plate spring that presses the electrically insulating gas passage plug upward with elastic force.

In the wafer placement table, the electrically conductive gas passage part is provided in the gas introduction passage, the electrically conductive gas passage part is in contact with the bottom surface of the electrically insulating gas passage plug, and the electrically conductive gas passage part is electrically continuous with the electrically conductive plate. Thus, in comparison with, for example, a case where an electrically insulating porous member is present on the bottom surface side of the electrically insulating gas passage plug, a potential difference is less likely to occur around an electrically conductive plate-side end of the electrically insulating gas passage plug. Therefore, it is possible to reduce discharge around the electrically conductive plate-side end of the electrically insulating gas passage plug. Since the plate spring presses the electrically insulating gas passage plug upward with elastic force, continuity from a contact part with the electrically insulating gas passage plug to the electrically conductive plate in the electrically conductive gas passage part is easily maintained.

[2] In the above-described wafer placement table (the wafer placement table according to [1]), the plate spring may be disposed in a state of being extended in a lateral direction perpendicular to an up and down direction by being pressed by the electrically insulating gas passage plug from above. With this configuration, the plate spring extends to expand in the lateral direction to make it easy to reduce a region in which the plate spring is not present just below the electrically insulating gas passage plug. Thus, it is possible to further reduce discharge around an electrically conductive plate-side end of the electrically insulating gas passage plug.

[3] In the above-described wafer placement table (the wafer placement table according to [2]), the plate spring may have a plurality of folded parts folded in the up and down direction.

[4] In the above-described wafer placement table (the wafer placement table according to [3]), the plurality of folded parts may include a first folded part folded from the top direction to the down direction and a second folded part folded from the down direction to the up direction, the first folded part may have a first plate-like part that extends in a horizontal direction and of which a top surface makes up a top surface of the plate spring, and the second folded part may have a second plate-like part that extends in the horizontal direction and of which a bottom surface makes up a bottom surface of the plate spring. With this configuration, it is possible to increase the contact area of the plate spring with an upper member since the plate spring has the first plate-like part, and it is possible to increase the contact area of the plate spring with a lower member since the plate spring has the second plate-like part. With this configuration, it is possible to further reliably bring the plate spring into contact with the upper and lower members, and, by extension, it is possible to further reliably maintain continuity from the contact part of the electrically conductive gas passage part with the electrically insulating gas passage plug to the electrically conductive plate.

[5] In the above-described wafer placement table (the wafer placement table according to any one of [1] to [4]), the electrically conductive gas passage part may have a coating layer that coats the bottom surface of the electrically insulating gas passage plug. In this case, the coating layer may be a dense layer having a hole that allows passage of gas. The coating layer may be a porous layer that allows passage of gas. Alternatively, the coating layer may coat part of the bottom surface of the electrically insulating gas passage plug and allow passage of gas in a non-coated part of the bottom surface.

[6] In the above-described wafer placement table (the wafer placement table according to any one of [1] to [5]), the electrically insulating gas passage plug may be a dense body having a gas internal flow channel, or a porous body.

[7] In the above-described wafer placement table (the wafer placement table according to any one of [1] to [6]), the electrically insulating gas passage plug may be a dense body having a gas internal flow channel, and an opening of a bottom end of the gas internal flow channel may be located outside a moving range of a top surface of the plate spring resulting from a positional shift in the gas introduction passage in a plan view. With this configuration, even when a positional shift of the plate spring occurs in the gas introduction passage, the top surface of the plate spring does not overlap the opening of the bottom end of the gas internal flow channel, so the plate spring is less likely to interfere with flow of gas between the gas introduction passage and the gas internal flow channel.

[8] In the above-described wafer placement table (the wafer placement table according to any one of [1] to [7]), the plate spring may have a hole that allows passage of gas. With this configuration, gas further easily passes through the electrically conductive gas passage part.

[9] The above-described wafer placement table (the wafer placement table according to [5]) may further include an electric conductor layer that coats a part of the bottom surface of the ceramic plate, exposed to the gas introduction passage, wherein the plate spring may be in contact with the electric conductor layer. With this configuration, a part of the bottom surface of the ceramic plate, exposed to the gas introduction passage, is coated with the electric conductor layer, and the electric conductor layer contacts with the plate spring to be electrically continuous with the electrically conductive plate via the plate spring, so a potential difference is less likely to occur around a part of the bottom surface of the ceramic plate, facing the inside of the gas introduction passage. Therefore, it is possible to reduce discharge around a part of the bottom surface of the ceramic plate, facing the inside of the gas introduction passage.

[10] The above-described wafer placement table (the wafer placement table according to [5]) may further include an electric conductor layer that coats a part of the bottom surface of the ceramic plate, exposed to an inside of the gas introduction passage, and an electrically conductive conduction member that is in contact with each of the electrically conductive plate and the electric conductor layer. With this configuration, the bottom surface of the ceramic plate is coated with the electric conductor layer, and the electric conductor layer is electrically continuous with the electrically conductive plate via the conduction member, so a potential difference is less likely to occur around a part of the bottom surface of the ceramic plate, facing the inside of the gas introduction passage. Therefore, it is possible to reduce discharge around a part of the bottom surface of the ceramic plate, facing the inside of the gas introduction passage.

[11] In the above-described wafer placement table (the wafer placement table according to [10]), the conduction member may be an elastic body that presses the electric conductor layer upward with elastic force. With this configuration, the conduction member presses the electric conductor layer upward with elastic force, so continuity from the electric conductor layer to the electrically conductive plate is easily maintained.

[12] In the above-described wafer placement table (the wafer placement table according to any one of [1] to [11]), the electrically conductive gas passage part may have a gas passage member that provides electrical continuity between the electrically conductive plate and the plate spring.

[13] In the above-described wafer placement table (the wafer placement table according to [12]), the gas passage member may be an elastic body.

DETAILED DESCRIPTION OF THE INVENTION

Next, an embodiment of the present invention will be described with reference to the accompanying drawings.

Figure 1:
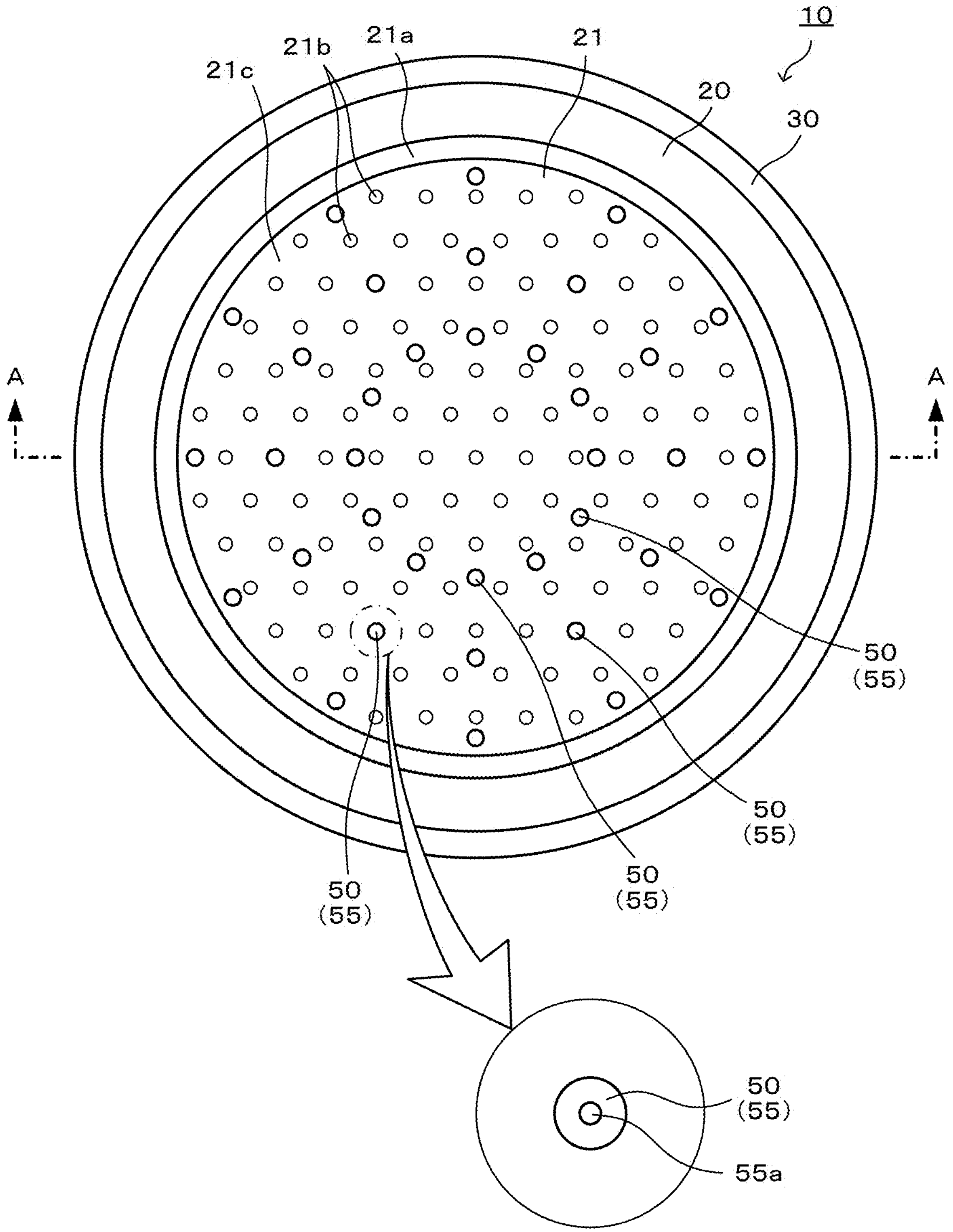
FIG. 1 is a plan view of a wafer placement table 10.
Figure 2:
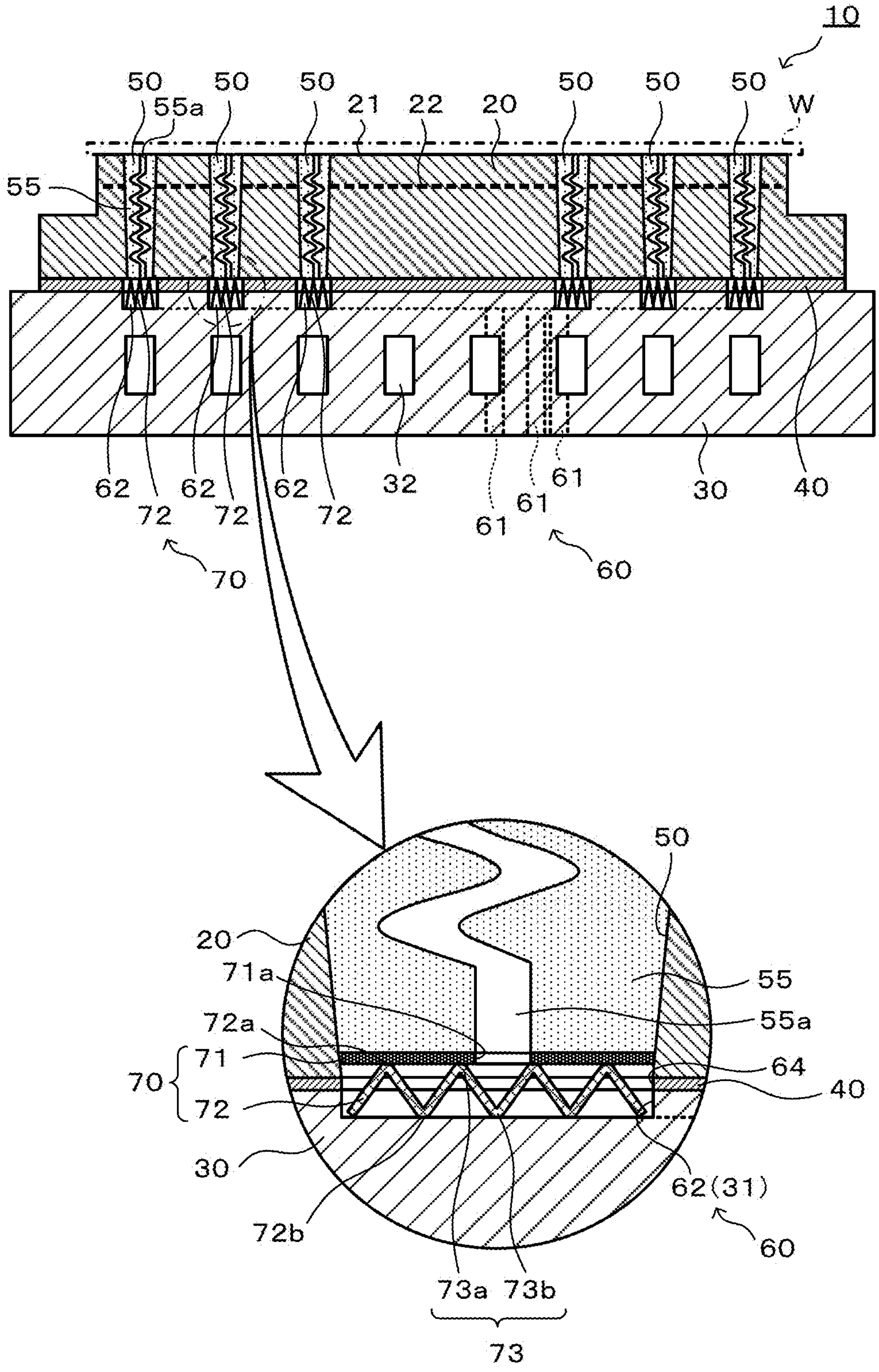
FIG. 2 is a sectional view taken along the line A-A in FIG. 1.
Figure 3:
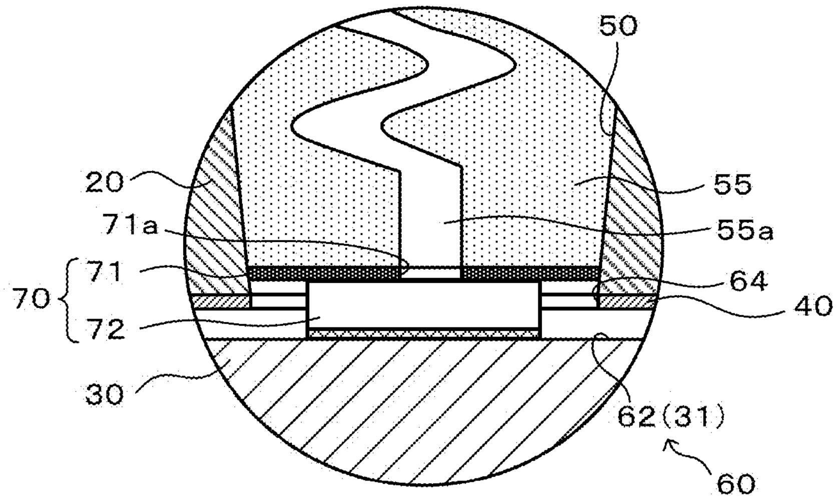
FIG. 3 is a partially enlarged sectional view that shows an area around a gas second passage 62 and an electrically conductive gas passage part 70.
Figure 5:
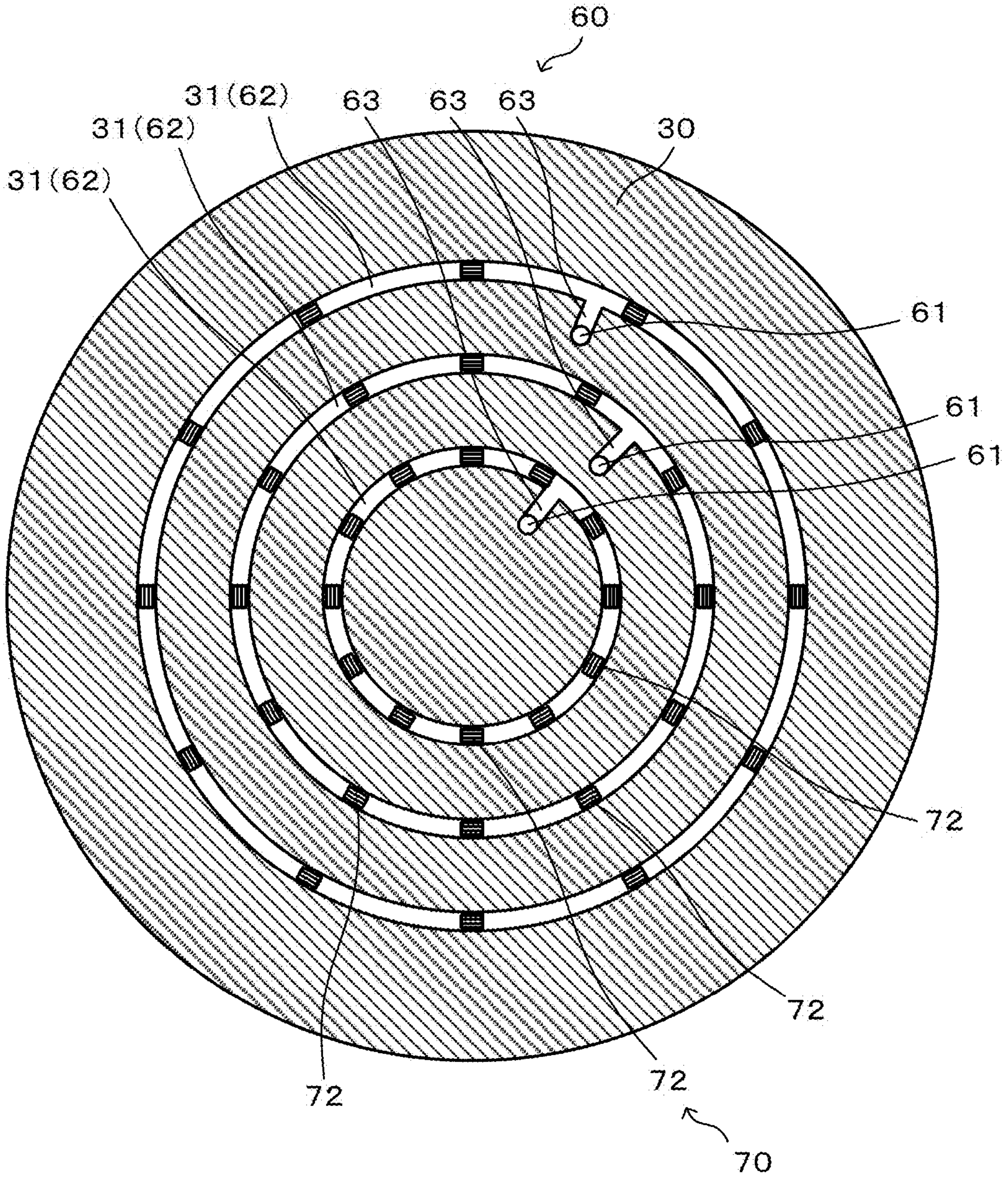
FIG. 5 is a sectional view of the wafer placement table 10, taken along a horizontal plane passing through the gas second passage 62 when viewed from above.
Figure 6:
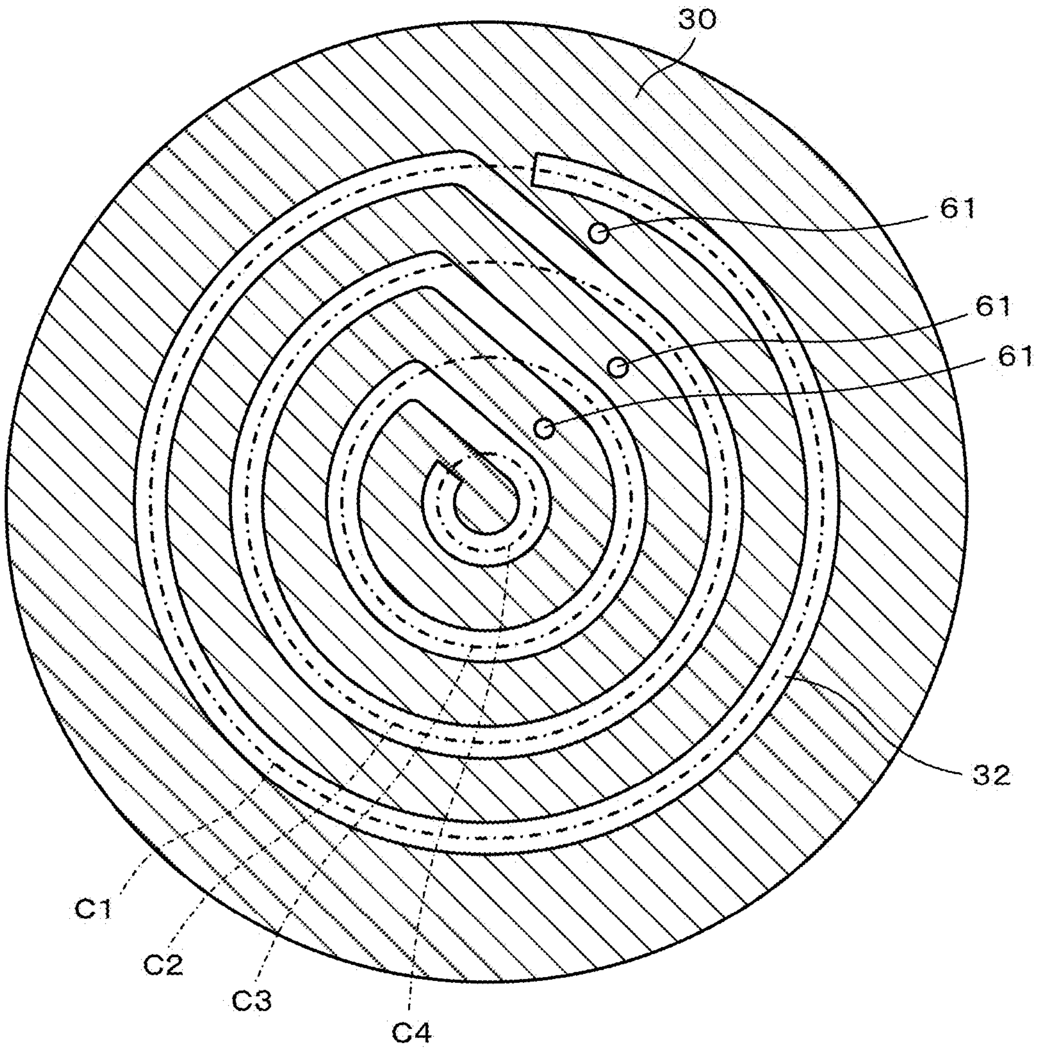
FIG. 6 is a sectional view of the wafer placement table 10, taken along a horizontal plane passing through a refrigerant flow path 32 when viewed from above.
Figure 7:
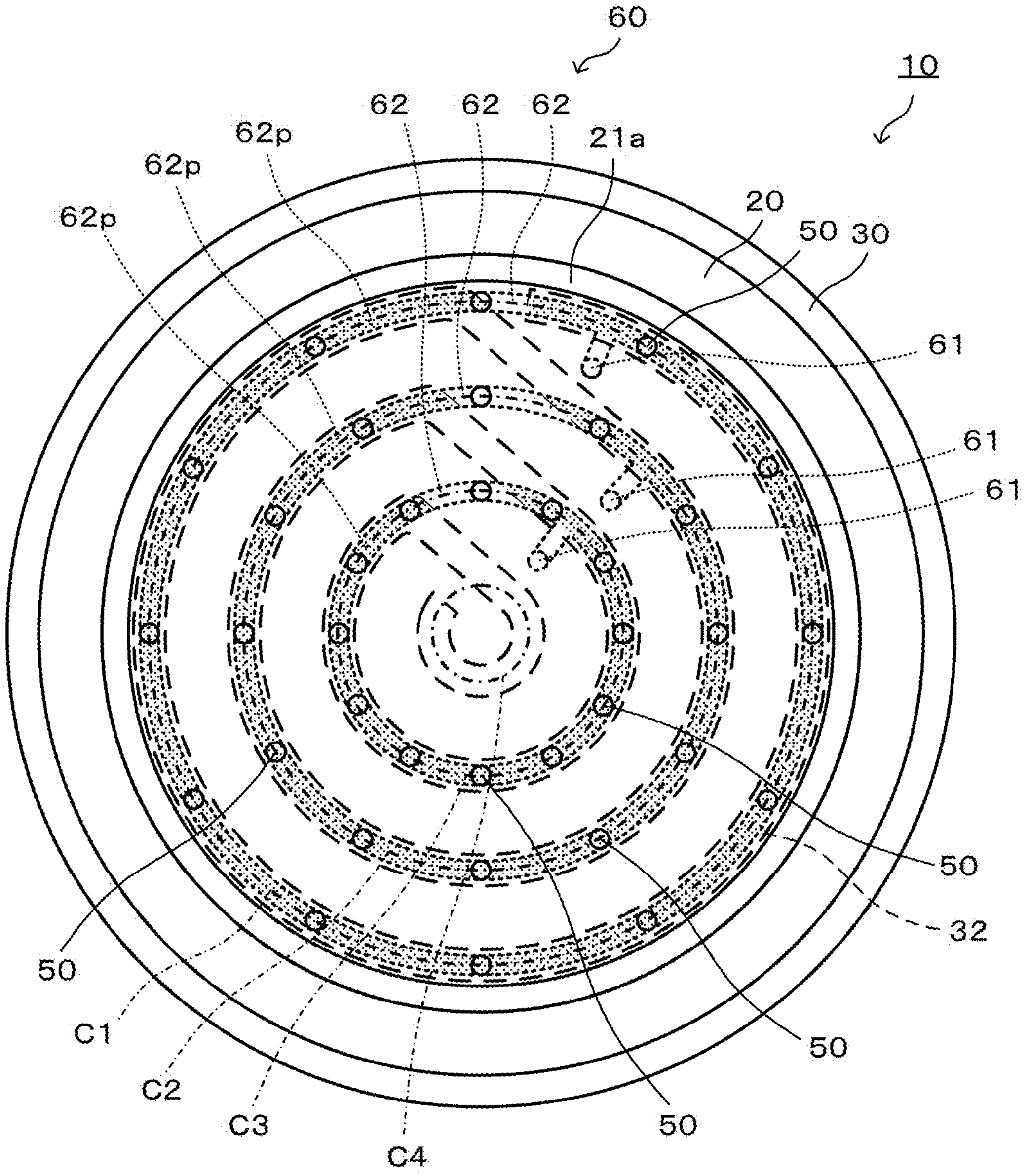
FIG. 7 is a view in which the refrigerant flow path 32 and the like are drawn in the plan view of the wafer placement table 10.

FIG. 1 is a plan view of a wafer placement table 10. FIG. 2 is a sectional view taken along the line A-A in FIG. 1. FIG. 3 is a partially enlarged sectional view that shows an area around a gas second passage 62 and an electrically conductive gas passage part 70. FIG. 5 is a sectional view of the wafer placement table 10, taken along a horizontal plane passing through the gas second passage 62 when viewed from above. FIG. 6 is a sectional view of the wafer placement table 10, taken along a horizontal plane passing through a refrigerant flow path 32 when viewed from above. FIG. 7 is a view in which the refrigerant flow path 32 and the like are drawn in the plan view of the wafer placement table 10. FIG. 3 is a partially enlarged sectional view of the wafer placement table 10, taken along a perpendicular plane along the gas second passage 62 and a perpendicular plane passing through the electrically conductive gas passage part 70. In the specification, the words "up and "down" do not indicate an absolute positional relationship. Therefore, depending on the orientation of the wafer placement table 10, "up" and "down" can be "down" and "up" or can be "left" and "right" or can be "front" and "rear".

As shown in FIG. 2, the wafer placement table 10 includes a ceramic plate 20, an electrically conductive plate 30, an electrically conductive bonding layer 40, ceramic plate penetrating parts 50, a gas introduction passage 60, and electrically conductive gas passage parts 70.

The ceramic plate 20 is a ceramic disk (for example, a diameter of 300 mm and a thickness of 5 mm), such as alumina sintered body and aluminum nitride sintered body. The top surface of the ceramic plate 20 is a wafer placement surface 21 on which a wafer W is placed. The ceramic plate 20 incorporates an electrode 22. As shown in FIG. 1, on the wafer placement surface 21 of the ceramic plate 20, an annular seal band 21*a* is formed along the outer edge, and a plurality of circular small projections 21*b* is formed all over the surface on the inner side of the seal band 21*a*. The seal band 21*a* and the circular small projections 21*b* have the same height and have a height of, for example, several micrometers to several tens of micrometers. The electrode 22 is a planar mesh electrode used as an electrostatic electrode and is connected to an external direct-current power supply via a power supply member (not shown). A low pass filter is disposed in the middle of the power supply member. The power supply member is electrically insulated from the electrically conductive bonding layer 40 and the electrically conductive plate 30. When a direct-current voltage is applied to the electrode 22, a wafer W is attracted and fixed to the wafer placement surface 21 (specifically, the top surface of the seal band and the top surfaces of the circular small projections) by electrostatic attraction force. When application of direct-current voltage is stopped, attraction and fixation of the wafer W to the wafer placement surface 21 are released. Part of the wafer placement surface 21 where the seal band 21*a* or the circular small projections 21*b* are not provided is referred to as a reference surface 21*c*.

The electrically conductive plate 30 is a disk having good thermal conductivity (a disk having a diameter equal to or greater than the diameter of the ceramic plate 20). The refrigerant flow path 32 in which refrigerant circulates is formed in the electrically conductive plate 30. Refrigerant flowing through the refrigerant flow path 32 is preferably liquid and preferably has electrical insulating properties. Examples of the liquid having electrically insulating properties include fluoroinert fluid. The refrigerant flow path 32 is formed in a one-stroke pattern from one end (inlet) to the other end (outlet) over the entire area of the electrically conductive plate 30 in plan view. As shown in FIG. 6, the refrigerant flow path 32 is provided so as to be routed in a one-stroke pattern from one end to the other end in accordance with multiple circles disposed such that a plurality of imaginary circles (alternate long and short-dashed line circles C1 to C4; here, the circles C1 to C4 are concentric circles) having different diameters in plan view. Specifically, to route the refrigerant flow path 32 in a one-stroke pattern from one end to the other end, the refrigerant flow path 32 is routed so as to trace the imaginary circles while connecting two inner and outer imaginary circles of the multiple circles. A supply port and collection port of an external refrigerant apparatus (not shown) are respectively connected to one end and the other end of the refrigerant flow path 32. Refrigerant supplied from the supply port of the external refrigerant apparatus to one end of the refrigerant flow path 32 passes through the refrigerant flow path 32 and then returns to the collection port of the external refrigerant apparatus from the other end of the refrigerant flow path 32, the refrigerant is adjusted in temperature, and then the refrigerant is supplied to one end of the refrigerant flow path 32 through the supply port again. The electrically conductive plate 30 is connected to a radio-frequency (RF) power supply and is also used as an RF electrode.

Examples of the material of the electrically conductive plate 30 include a metal material and a composite material of metal and ceramic. Examples of the metal material include Al, Ti, Mo, and alloys of them. Examples of the composite material of metal and ceramic include a metal matrix composite material (MMC) and a ceramic matrix composite material (CMC). Specific examples of such composite materials include a material including Si, SiC, and Ti (also referred to as SisiCTi), a material obtained by impregnating an SiC porous body with Al and/or Si, and a composite material of $Al_2O_3$ and TiC. A material having a coefficient of thermal expansion close to that of the material of the ceramic plate 20 is preferably selected as the material of the electrically conductive plate 30.

The electrically conductive bonding layer 40 is, for example, a metal bonding layer and bonds the bottom surface of the ceramic plate 20 with the top surface of the electrically conductive plate 30. The electrically conductive bonding layer 40 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material.

As shown in FIG. 2, the ceramic plate penetrating parts 50 are holes that extend through the ceramic plate 20 in an up and down direction. The ceramic plate penetrating parts 50 are passages of gas from the bottom surface of the ceramic plate 20 to the reference surface 21*c* (FIG. 1) of the wafer placement surface 21. As shown in FIG. 1, the plurality of (here, 36) ceramic plate penetrating parts 50 is provided. As shown in FIG. 2, the ceramic plate penetrating part 50 is a space having a shape of which the cross-sectional area reduces from an upper opening toward a lower opening (for example, an inverted truncated cone shape). The ceramic plate penetrating part 50 has an electrically insulating dense plug 55 (an example of the electrically insulating gas passage plug) that allows gas to flow in the up and down direction.

The dense plug 55 is a member having a shape of which the cross-sectional area reduces from the top surface toward the bottom surface (for example, a truncated cone shape) as in the case of the shape of the ceramic plate penetrating part 50. The dense plug 55 has a gas internal flow channel 55*a*.

The gas internal flow channel 55*a* is a flow channel that allows flow of gas between the top surface side and bottom surface side of the dense plug 55. The gas internal flow channel 55*a* is a passage that extends through from the top surface side to the bottom surface side of the dense plug 55 while being bent, and, more specifically, configured as a zigzag passage. Another example of the passage that extends through while being bent includes a spiral passage. The gas internal flow channel 55*a* may be a through-hole in a straight line in the up and down direction. The diameter of the flow channel cross section of the gas internal flow channel 55*a* is preferably greater than or equal to 0.1 mm and less than or equal to 1 mm. The single dense plug 55 may have a plurality of the gas internal flow channels 55*a*. The porosity of a dense part of the dense plug 55 is preferably lower than 0.18. The dense plug 55 is fixed by being press-fitted to the ceramic plate penetrating part 50. For example, ceramic, such as alumina and aluminum nitride, may be used as the dense plug 55. The dense plug 55 may be manufactured by, for example, firing a molded body molded by using a 3D printer or firing a molded body molded by mold cast. The details of the dense plug having a gas internal flow channel that extends through while being bent, and mold cast are described in, for example, Japanese Patent No. 7149914 or the like.

The top surface of the dense plug 55 has the same level as the reference surface 21*c* of the wafer placement surface 21. The bottom surface of the dense plug 55 is coated with a coating layer 71 that is part of the electrically conductive gas passage part 70. The bottom surface of the dense plug 55 is located at the level higher than an opening plane of the bottom of the ceramic plate penetrating part 50 (the same level as the bottom surface of the ceramic plate 20) as shown in FIGS. 2 and 3. The bottom surface of the dense plug 55 may be at the same level as the opening plane of the bottom of the ceramic plate penetrating part 50. The bottom surface of the dense plug 55 may be located at the level lower than the opening plane of the bottom of the ceramic plate penetrating part 50. In other words, a bottom end of the dense plug 55 may protrude downward beyond the bottom surface of the ceramic plate 20.

The gas introduction passage 60 is provided at least inside the electrically conductive plate 30 and is a passage of gas, which communicates with the ceramic plate penetrating parts 50. The gas introduction passage 60 includes gas first passages 61, the gas second passages 62, gas auxiliary passages 63 (FIG. 5), and bonding layer penetrating parts 64. The gas introduction passage 60 includes gas passages (the gas first passages 61, the gas second passages 62, and the gas auxiliary passages 63) provided in the electrically conductive plate 30, and gas passages (the bonding layer penetrating parts 64) provided in the electrically conductive bonding layer 40.

The gas first passages 61 extend through the electrically conductive plate 30 in the up and down direction. The gas first passages 61 extend through the electrically conductive plate 30 in the up and down direction between parts of the refrigerant flow path 32. The plurality of (hereinafter, three) gas first passages 61 is provided.

The gas second passages 62 are provided parallel to the wafer placement surface 21 at the interface between the electrically conductive bonding layer 40 and the electrically conductive plate 30. The state "parallel" includes not only a completely parallel state but also a state that falls within the range of an allowable error (for example, tolerance) even when the state is not completely parallel. The gas second passages 62 each have a recessed groove 31 (first recessed portion) provided on the top surface of the electrically conductive plate 30 and each are formed when the top surface of the recessed groove 31 is covered with the electrically conductive bonding layer 40. As shown in FIG. 7, each of the gas second passages 62 is provided in an annular shape so as to overlap any one of the plurality of imaginary circles C1 to C4 in a plan view. Specifically, of the three gas second passages 62, the first gas second passage 62 from the outer periphery of the wafer placement table 10 overlaps the imaginary circle C1 with the greatest diameter, the second gas second passage 62 overlaps the imaginary circle C2 with the second greatest diameter, and the third gas second passage 62 overlaps the imaginary circle C3 with the third greatest diameter. Each of the gas second passages 62 has an overlapping part 62*p* (the shaded parts in FIG. 7) that overlaps the refrigerant flow path 32 along the refrigerant flow path 32 in a plan view.

Each of the gas auxiliary passages 63 is a passage that connects the gas first passage 61 with the gas second passage 62 and is provided parallel to the wafer placement surface 21 at the interface between the electrically conductive bonding layer 40 and the electrically conductive plate 30. The plurality of (here, 12) ceramic plate penetrating parts 50 is provided for each gas second passage; however, the number of the gas first passages 61 and the number of the gas auxiliary passages 63 are less than the number of the ceramic plate penetrating parts 50 (here, one for each gas second passage 62).

As shown in FIG. 2, the bonding layer penetrating part 64 is a hole that extends through the electrically conductive bonding layer 40 in the up and down direction. The bonding layer penetrating part 64 is a passage of gas, which extends from the top surface of the electrically conductive plate 30 to the bottom surface of the ceramic plate 20. The plurality of (here, 36) bonding layer penetrating parts 64 is disposed in a one-to-one correspondence with the ceramic plate penetrating parts 50. In the present embodiment, the diameter of the bonding layer penetrating part 64 is equal to or greater than the diameter of the opening of the bottom of the ceramic plate penetrating part 50.

The electrically conductive gas passage part 70 is provided in the gas introduction passage 60. The electrically conductive gas passage part 70 is provided so as to be in contact with the bottom surface of the dense plug 55, to be electrically continuous with the electrically conductive plate 30, and to allow passage of gas between the dense plug 55 and the gas introduction passage 60. The electrically conductive gas passage part 70 has a coating layer 71 and a plate spring 72. The coating layer 71 coats the bottom surface of the dense plug 55. Thus, the coating layer 71 is in contact with the bottom surface of the dense plug 55. The coating layer 71 is formed as a dense layer and has a hole 71*a* that allows gas to pass in the up and down direction. The hole 71*a* communicates the opening of the gas internal flow channel 55*a* at the bottom surface of the dense plug 55 with the gas introduction passage 60. The coating layer 71 can be manufactured by, for example, forming a coating layer by sputtering, electroless plating, or the like in advance on the bottom surface of the dense plug 55 before the dense plug 55 is press-fitted to the ceramic plate 20 and then perforating the hole 71*a*. The material of the coating layer 71 is, for example, a metal material and is preferably a metal excellent in anti-corrosion, such as Au, Ag, Al, Ti, SUS316L, and hastelloy (Ni–Fe—Mo-based alloy, hastelloy is a registered trademark).

Figure 4:
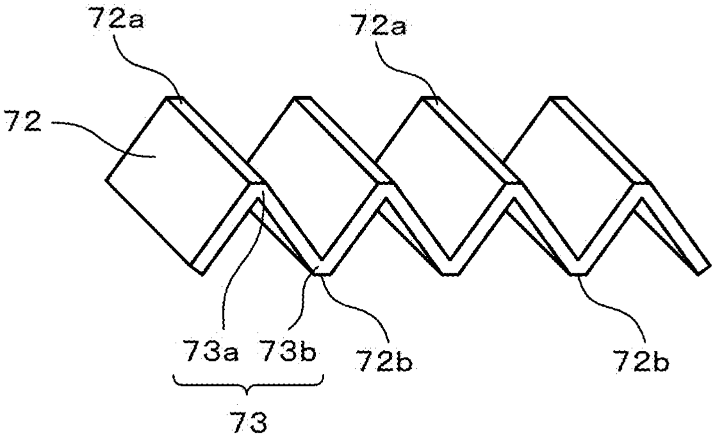
FIG. 4 is a perspective view of a plate spring 72 of the electrically conductive gas passage part 70.

The plate spring 72 is an electrically conductive elastic body that presses the dense plug 55 upward with elastic force. Examples of the material of the plate spring 72 include metal materials, such as Al, Ti, Mo, alloys of them, steel, SUS316L, and hastelloy (registered trademark). The plate spring 72 is, for example, manufactured by bending a metal plate and has such a shape that a metal plate is folded in a zigzag shape in the present embodiment. A zigzag folding direction of the plate spring 72 is the up and down direction. In other words, the plate spring 72 has a plurality of folded parts 73 folded in the up and down direction. Each of the folded parts 73 of the plate spring 72 is formed in a V-shape. The plate spring 72 has one or more (here, multiple and specifically four) first folded parts 73*a* folded downward and one or more (here, multiple and specifically three) second folded parts 73*b* folded upward as the plurality of folded parts 73. For this reason, in the present embodiment, the number of times of folding of the plate spring 72 is seven. The top surface 72*a* of the plate spring 72 (the top surfaces of the first folded parts 73*a* of the plate spring 72, see also FIG. 4) is in contact with the bottom surface of the coating layer 71. The plate spring 72 is provided to extend over the inside of the ceramic plate penetrating part 50, the inside of the bonding layer penetrating part 64 in the gas introduction passage 60, and the inside of the gas second passage 62. The bottom surface 72*b* of the plate spring 72 (the bottom surfaces of the second folded parts 73*b* of the plate spring 72, see also FIG. 4) is in contact with the electrically conductive plate 30 at a part of the bottom surface (lower end surface) of the gas second passage 62 (recessed groove 31), located just below the bonding layer penetrating part 64. The plate spring 72 is in contact with the electrically conductive plate 30, so the plate spring 72 is electrically continuous with the electrically conductive plate 30. In the present embodiment, since the zigzag folding direction of the plate spring 72 is the up and down direction, a main extension and contraction direction of the plate spring 72 is not the up and down direction of FIG. 2, that is, a direction to press the dense plug 55, but a right and left direction of FIG. 2. In other words, the plate spring 72 is disposed horizontally. However, when the plate spring 72 has a zigzag shape and is placed in a state of being extended in the lateral direction perpendicular to the up and down direction (the plates of the plate spring 72 are further inclined with respect to the up and down direction) when pressed by the dense plug 55 from above, elastic force is exercised also in the up and down direction from the plate spring 72 as a force to attempt to return from extension (a force that the plates of the plate spring 72 attempt to return to a state in a direction in the up and down direction from the inclined state). With this elastic force, the plate spring 72 presses the dense plug 55 upward. Similarly, the plate spring 72 presses the electrically conductive plate 30 downward with elastic force.

At least one of the shape and arrangement position of the plate spring 72 is adjusted so that the hole 71*a* of the coating layer 71 (and the opening of the bottom end of the gas internal flow channel 55*a*) is not completely closed to block flow of gas. As shown in FIG. 2, in the present embodiment, since the width of each of the four top surfaces 72*a* that are contact surfaces of the plate spring 72 with the coating layer 71 is smaller than the opening diameter of the hole 71*a*, the plate spring 72 does not completely close the hole 71*a* of the plate spring 72 (and the opening of the bottom end of the gas internal flow channel 55*a*) regardless of the arrangement position. In this way, the coating layer 71 has the hole 71*a* and the plate spring 72 does not block flow of gas through the hole 71*a*, so gas in the gas introduction passage 60 can pass through the inside and/or surrounding of the electrically conductive gas passage part 70 and flow to the ceramic plate penetrating part 50. In other words, the electrically conductive gas passage part 70 permits passage of gas between the dense plug 55 and the gas introduction passage 60.

The plate spring 72 is disposed such that surface directions of the plates are aligned in the flow direction of gas in the gas second passage 62 (a tangential direction of a circular arc of the gas second passage 62 shown in FIG. 5) in which the plate spring 72 is disposed (FIGS. 2 and 3). Thus, the plate spring 72 is less likely to interfere with flow of gas in the gas second passage 62. However, the plate spring 72 may be disposed such that the surface directions of the plates of the plate spring 72 are perpendicular to the flow direction of gas in the gas second passage 62 in which the plate spring 72 is disposed.

In the present embodiment, the plurality of (here, 36) electrically conductive gas passage parts 70 is provided and is disposed in a one-to-one correspondence with the dense plugs 55. In other words, the coating layer 71 and the plate spring 72 each are disposed in a one-to-one correspondence with the dense plug 55.

Next, an example of use of the thus configured wafer placement table 10 will be described. Initially, in a state where the wafer placement table 10 is placed in a chamber (not shown), a wafer W is mounted on the wafer placement surface 21. Then, the inside of the chamber is decompressed by a vacuum pump and adjusted into a predetermined degree of vacuum, and electrostatic attraction force is generated by applying a direct-current voltage to the electrode 22 of the ceramic plate 20 to attract and fix the wafer W to the wafer placement surface 21 (specifically, the top surface of the seal band 21*a* and the top surfaces of the circular small projections 21*b*). Subsequently, the inside of the chamber is set to a reaction gas atmosphere with a predetermined pressure (for example, several tens to several hundreds of pascals). In this state, plasma is generated by applying an RF voltage between an upper electrode (not shown) provided at a ceiling part in the chamber and the electrically conductive plate 30 of the wafer placement table 10. The surface of the wafer W is processed by the generated plasma. Refrigerant circulates through the refrigerant flow path 32 of the electrically conductive plate 30. Back-side gas is introduced from a gas cylinder (not shown) to the gas first passages 61 of the gas introduction passage 60. Heat transfer gas (for example, He gas or the like) may be used as the back-side gas. Back-side gas introduced into the gas first passages 61 is distributed to the plurality of ceramic plate penetrating parts 50 through the gas auxiliary passages 63, the gas second passages 62, and the electrically conductive gas passage parts 70 in this order and supplied into the space between the back side of the wafer W and the reference surface 21*c* of the wafer placement surface 21 to be encapsulated. With the presence of the back-side gas, heat transfer between the wafer W and the ceramic plate 20 is efficiently performed. Since the dense plug 55 is provided in the ceramic plate penetrating part 50, it is possible to reduce discharge in the ceramic plate penetrating part 50. Furthermore, since the gas internal flow channel 55*a* is a bent flow channel, it is possible to reduce discharge in the gas internal flow channel 55*a* as compared to a case of a straight flow channel.

Figure 8A:
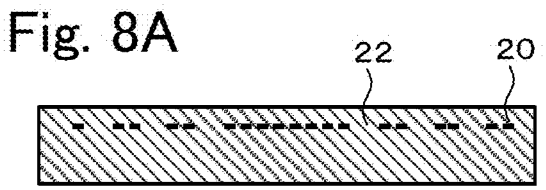
FIGS. 8A to 8F are manufacturing process charts of the wafer placement table 10.
Figure 8B:
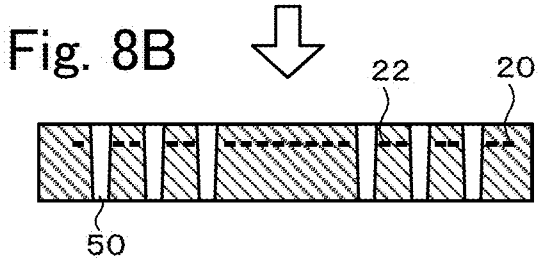

Next, an example of manufacture of the wafer placement table 10 will be described with reference to FIGS. 8A to 8F and 9A to 9C. FIGS. 8A to 8F are manufacturing process charts of the wafer placement table 10. FIGS. 9A to 9C are views that show a state of the plate spring 72 pressed against the dense plug 55 when the wafer placement table 10 is manufactured. Here, the case in which the electrically conductive plate 30 is made from an MMC will be illustrated. First, the ceramic plate 20 incorporating the electrode 22 is prepared (FIG. 8A). For example, a molded body of ceramic powder, incorporating the electrode 22, is made, and the ceramic plate 20 is obtained by firing the molded body by hot pressing. The ceramic plate penetrating parts 50 are formed in the ceramic plate 20 (FIG. 8B). The ceramic plate penetrating parts 50 are formed so as to extend through the ceramic plate 20 in the up and down direction of the electrode 22.

Figure 8C:
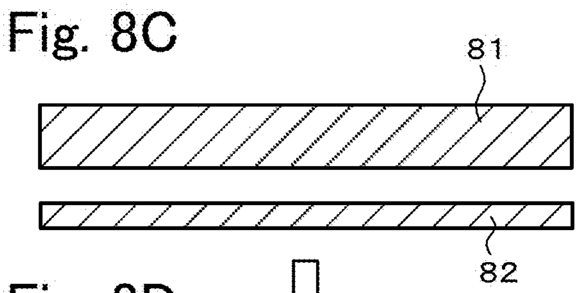
Figure 8D:
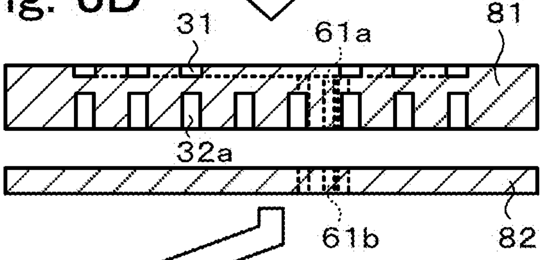
Figure 9A:
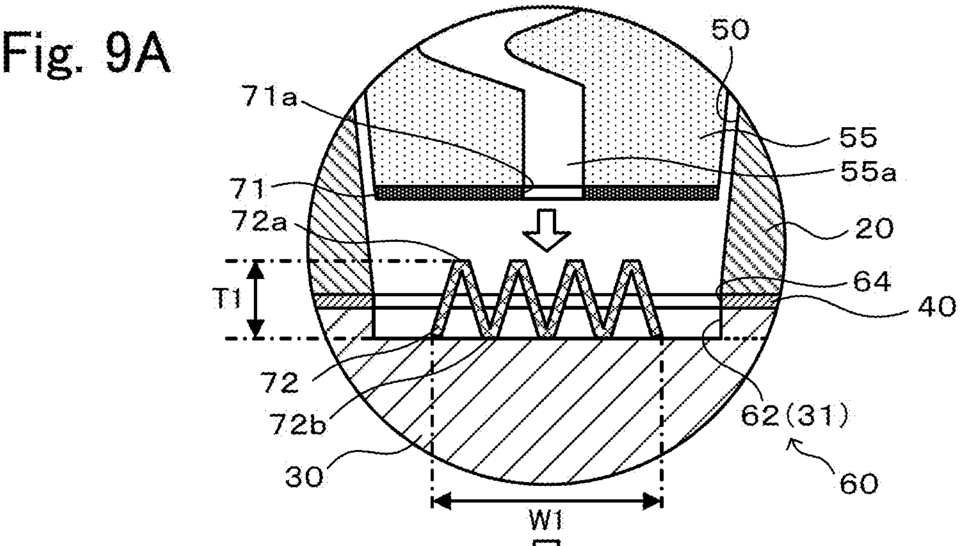
FIGS. 9A to 9C are views that show a state of the plate spring 72 pressed against a dense plug 55 when the wafer placement table 10 is manufactured.
Figure 9B:
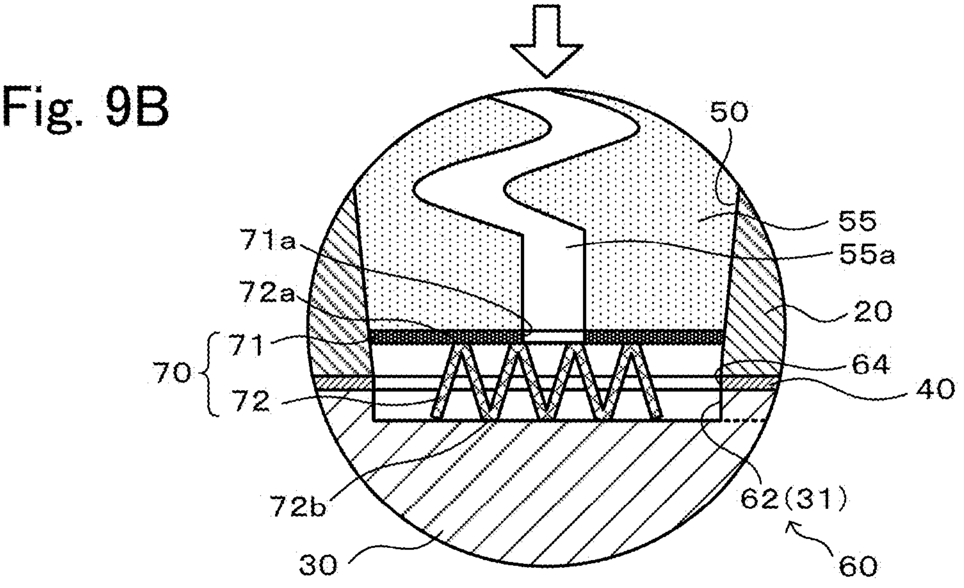
Figure 9C:
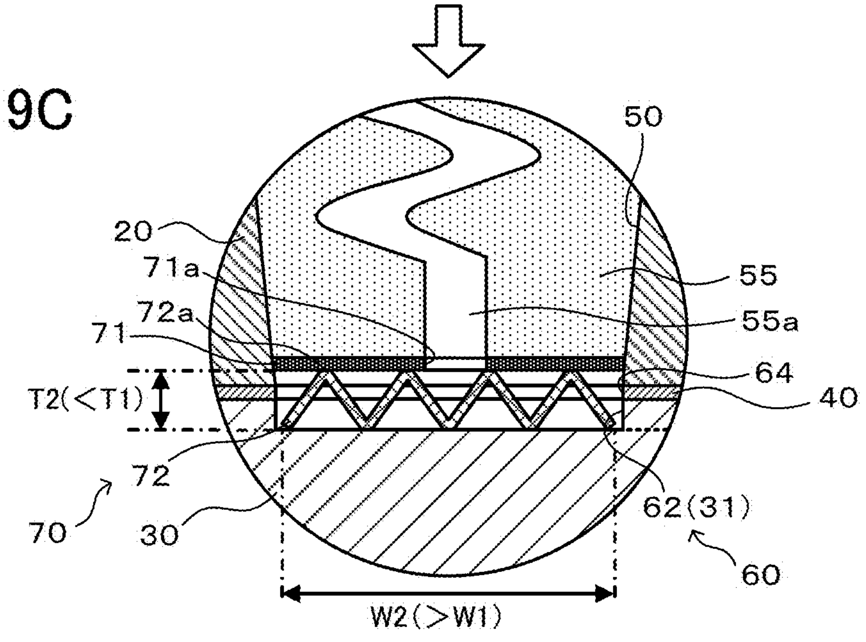

Concurrently, two MMC disk members 81, 82 are prepared (FIG. 8C). Grooves and holes are formed as needed in the MMC disk members 81, 82 by machining (FIG. 8D). Specifically, recessed grooves 32*a* that will be finally the refrigerant flow paths 32 are formed on the bottom surface of the upper-side MMC disk member 81, and recessed grooves 31 that will be finally the gas second passages 62 are formed on the top surface of the MMC disk member 81. Through-holes 61*a* that will be finally parts of the gas first passages 61 are formed so as to extend from the recessed grooves 31 to the bottom surface of the MMC disk member 81. In addition, through-holes 61*b* that will be finally parts of the gas first passages 61 are formed in the lower-side MMC disk member 82. When the ceramic plate 20 is made of alumina, the MMC disk members 81, 82 are preferably made of SisiCTi or AlSiC. This is because the coefficient of thermal expansion of alumina and the coefficient of thermal expansion of SisiCTi or AlSiC are almost the same.

The disk member made of SisiCTi can be made, for example, as follows. Initially, a powder mixture is made by mixing silicon carbide, metal Si, and metal Ti. After that, a disk-shaped molded body is made by uniaxial pressing of the obtained powder mixture, and the molded body is sintered by hot pressing in an inert atmosphere, with the result that the disk member made of SisiCTi is obtained.

Figure 8E:
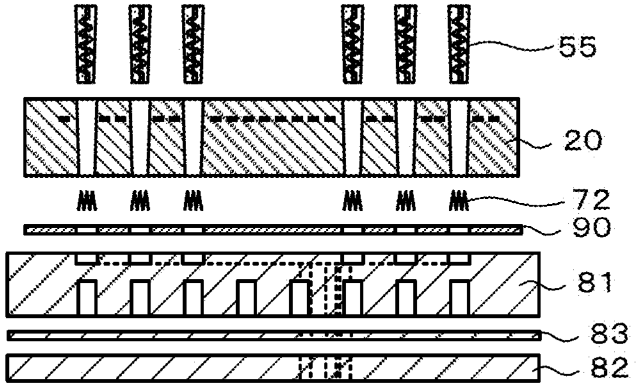
Figure 8F:
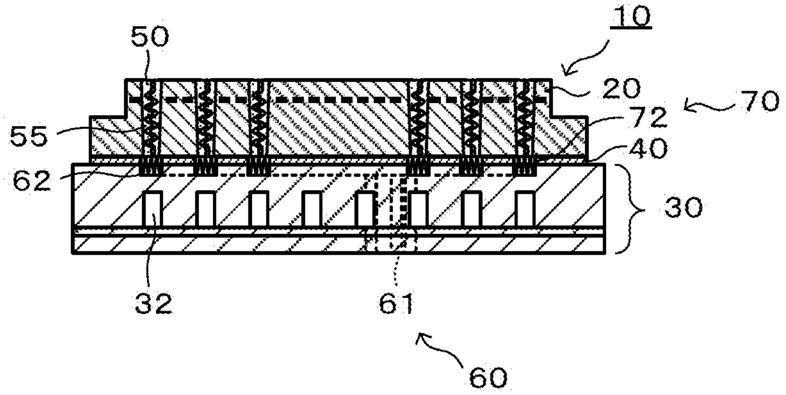

Subsequently, after the ceramic plate 20, the MMC disk member 81, and the MMC disk member 82 are bonded by TCB, the overall shape is adjusted, and the dense plugs 55 are attached, with the result that the wafer placement table 10 is obtained (FIGS. 8E and 8F). Specifically, a laminated body is obtained by sandwiching a metal bonding material 83 between the top surface of the lower-side MMC disk member 82 and the bottom surface of the upper-side MMC disk member 81, and sandwiching a metal bonding material 90 between the top surface of the upper-side MMC disk member 81 and the bottom surface of the ceramic plate 20. Through-holes that will be finally parts of the gas first passages 61 are formed in advance in the metal bonding material 83, and through-holes that will be finally the bonding layer penetrating parts 64 are formed in advance in the metal bonding material 90. After the metal bonding material 90 is disposed on the top surface of the MMC disk member 81, the plate springs 72 are inserted in advance into the through-holes that will be the bonding layer penetrating parts 64 and inside the recessed grooves 31 just below them. Subsequently, the laminated body is pressurized at a temperature lower than or equal to a solidus temperature of the metal bonding materials 83, 90 (for example, higher than or equal to a temperature obtained by subtracting 20° C. from the solidus temperature and lower than or equal to the solidus temperature) to perform bonding, after that the temperature is returned to a room temperature. Thus, the two MMC disk members 81, 82 are bonded by the metal bonding material 83 into the electrically conductive plate 30. The ceramic plate 20 and the electrically conductive plate 30 are bonded by the metal bonding material 90. The metal bonding material 90 becomes the electrically conductive bonding layer 40. An Al—Mg bonding material or an Al—Si—Mg bonding material may be used as the metal bonding materials 83, 90 at this time. When, for example, TCB is performed by using an Al—Si—Mg bonding material, the laminated body is pressurized in a state of being heated under vacuum atmosphere. The metal bonding materials 83, 90 with a thickness of about 100 μm are preferable.

Attachment of the dense plug 55 is, for example, performed as follows. Initially, the dense plug 55 formed by firing is prepared in advance, and the coating layer 71 is formed on the bottom surface of the dense plug 55. After that, the dense plug 55 is inserted into the ceramic plate penetrating part 50 from above to bring the coating layer 71 at the bottom surface of the dense plug 55 into contact with the plate spring 72 (FIGS. 9A and 9B), and the dense plug 55 is further pressed downward. Thus, the dense plug 55 is press-fitted into the ceramic plate penetrating part 50, and the dense plug 55 presses the plate spring 72 (the dense plug 55 presses the plate spring 72 via the coating layer 71) to bring the plate spring 72 into an elastically deformed state (FIG. 9C). Thus, in the manufactured wafer placement table 10, the plate springs 72 are disposed in a state extended in the lateral direction perpendicular to the up and down direction. In other words, each of the plate springs 72 extends from a width W1 (FIG. 9A) in the horizontal direction, which is a natural length before being pressed against the dense plug 55, and changes into a width W2 greater than the width W1 (FIG. 9C). With this extension in the horizontal direction, each of the plate springs 72 changes from a height T1 (FIG. 9A) in the up and down direction before being pressed against the dense plug 55 to a height T2 less than the height T1 (FIG. 9C). Thus, the plate springs 72 generate not only elastic force in the lateral direction but also in the up and down direction as described above, with the result that the top surfaces 72*a* of the plate springs 72 are in a state of pressing the dense plugs 55 upward. In this way, the dense plugs 55 are press-fitted to the ceramic plate penetrating parts 50 such that not only the dense plugs 55 are in contact with the plate springs 72 via the coating layers 71 but also the dense plugs 55 press the plate springs 72 downward. Thus, the dense plugs 55 further reliably contact with the plate springs 72 via the coating layers 71, so it is possible to further reliably provide continuity among the coating layers 71, the plate springs 72, and the electrically conductive plate 30.

In the wafer placement table 10 described in detail above, the electrically conductive gas passage part 70 is provided in the gas introduction passage 60 (here, in the gas second passage 62 and in the bonding layer penetrating part 64), the electrically conductive gas passage part 70 is in contact with the bottom surface of the dense plug 55, and the electrically conductive gas passage part 70 is electrically continuous with the electrically conductive plate 30. For this reason, since the electrically conductive gas passage part 70 having the same potential as the electrically conductive plate 30 is in contact with the dense plug 55, it is possible to reduce discharge in an area around the electrically conductive plate 30-side end of the dense plug 55, that is, an area around the bottom end of the dense plug 55. It is also possible to reduce discharge in an area around the bottom end of the dense plug 55 even when, for example, an electrically insulating porous member is present instead of the electrically conductive gas passage part 70 on the bottom surface of the dense plug 55; however, a potential difference is less likely to occur in an area around the electrically conductive plate 30-side end of the dense plug 55 when the electrically conductive gas passage part 70 is present, so it is possible to further reduce discharge. Thus, with the wafer placement table 10 according to the present embodiment, in comparison with a case where an electrically insulating porous member is present instead of the electrically conductive gas passage part 70, it is possible to, for example, increase the power of a radio-frequency (RF) power supply connected to the electrically conductive plate 30. There is a demand for increasing the gas pressure of back-side gas for the purpose of further increasing the efficiency of heat transfer between a wafer W and the ceramic plate 20; however, discharge generally more easily occurs when the gas pressure is increased. With the wafer placement table 10 according to the present embodiment, since it is possible to further reduce discharge with the electrically conductive gas passage part 70, the gas pressure can be increased as compared to a case where an electrically insulating porous member is present instead of the electrically conductive gas passage part 70. The electrically conductive gas passage part 70 has the plate spring 72 that presses the dense plug 55 upward with elastic force. Thus, since the dense plug 55 further reliably contacts with the plate spring 72 via the coating layer 71, continuity from a contact part with the dense plug 55 (here, the top surface of the coating layer 71) in the electrically conductive gas passage part 70 to the electrically conductive plate 30 is easily maintained. It is also possible to reduce discharge by using the electrically conductive gas passage part 70 including the plate spring 72, so it is easy to reduce the height of a space around the bottom end of the dense plug 55 (here, a height from the bottom surface of the coating layer 71 to the lower end surface of the recessed groove 31) and to reduce discharge. For example, the height of the space around the bottom end of the dense plug 55 may be less than or equal to 0.5 mm, may be less than or equal to 0.3 mm, or may be less than or equal to 0.17 mm.

The plate spring 72 is disposed in a state of being extended in the lateral direction perpendicular to the up and down direction when pressed by the dense plug 55 from above. Thus, the plate spring 72 extends to expand in the lateral direction to make it easy to reduce a region in which the plate spring 72 is not present just below the dense plug 55. Thus, it is possible to further reduce discharge around the electrically conductive plate 30-side end of the dense plug 55. For example, in a state where the plate spring 72 is not extended in the lateral direction as shown in FIG. 9B, there are concerns that the effect of reducing discharge reduces in a space to the right or left of the plate spring 72 in the space just below the dense plug 55. In contrast, when the plate spring 72 expands in the lateral direction as shown in FIG. 9C, the effect of reducing discharge increases. There is a case where the plate spring 72 is intended to be replaced in the wafer placement table 10, for example, a case where the elastic force of the plate spring 72 has decreased as a result of long-term use of the wafer placement table 10 or the like. In this case, in the above-described embodiment, the plate spring 72 returns to a state before the plate spring 72 extends in the lateral direction as shown in FIG. 9A (the width in the lateral direction becomes W1 less than W2) by removing the dense plug 55 from the ceramic plate 20 of the wafer placement table 10, the plate spring 72 is easily taken out, with the result that replacement of the plate spring 72 is easy.

The present invention is not limited to the above-described embodiment and may be, of course, implemented in various modes within the technical scope of the present invention.

Figure 10:
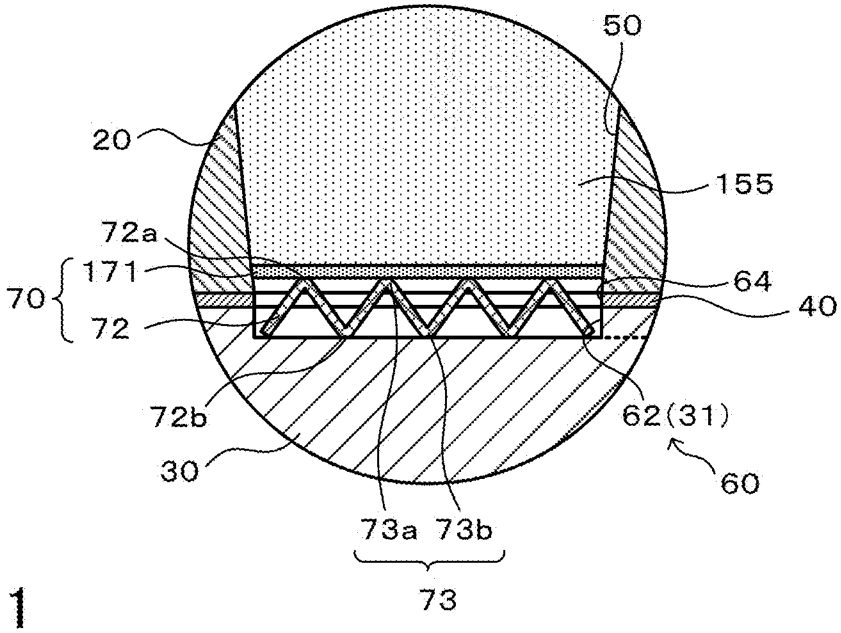
FIG. 10 is a partially enlarged sectional view that shows a porous plug 155 and a coating layer 171.

For example, in the above-described embodiment, the dense plug 55 having the gas internal flow channel 55*a* is provided in the ceramic plate penetrating part 50; however, the configuration is not limited to the dense plug 55. An electrically insulating gas passage plug that allows gas to pass just needs to be provided in the ceramic plate penetrating part 50. For example, a porous plug may be used as the electrically insulating gas passage plug. Similarly, the coating layer 71 also just needs to allow passage of gas. For example, the coating layer 71 may be an electrically conductive porous layer instead of having the hole 71*a*. For example, a porous plug 155 and a coating layer 171 shown in FIG. 10 make up a porous body. For example, a porous bulk body obtained by sintering using ceramic powder may be used as the porous plug 155. For example, alumina, aluminum nitride, or the like may be used as ceramic. The porous plug 155 preferably has a porosity of higher than or equal to 30% and preferably has a mean pore size of greater than or equal to 20 μm. The porosity of the porous plug 155 may be lower than or equal to 70%. The coating layer 171 serving as a metal porous layer can be formed on the bottom surface of the porous plug 155 by using porous plating. The dense plug 55 and the coating layer 171 may be combined with each other, and the porous plug 155 and the coating layer 71 may be combined with each other. In the above-described embodiment, the coating layer 71 has the hole 71*a* to allow passage of gas. Alternatively, the coating layer 71 may coat part of the bottom surface of the dense plug 55 and may allow passage of gas at an uncoated part of the bottom surface.

Figure 11:
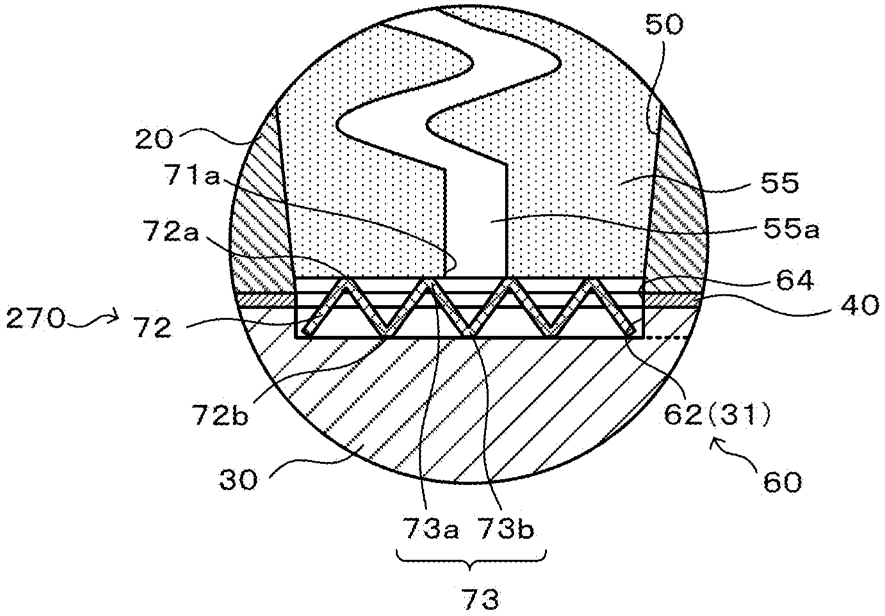
FIG. 11 is a partially enlarged sectional view that shows an electrically conductive gas passage part 270.

In the above-described embodiment, the electrically conductive gas passage part 70 does not need to include the coating layer 71. For example, an electrically conductive gas passage part 270 shown in FIG. 11 does not include the coating layer 71 and includes the plate spring 72. In FIG. 11, the top surface 72*a* of the plate spring 72 directly contacts with the dense plug 55 to press the dense plug 55 upward with elastic force. With this configuration as well, as in the case of the above-described embodiment, it is possible to reduce discharge around the electrically conductive plate 30-side end of the dense plug 55, that is, around the bottom end of the dense plug 55.

Figure 12:
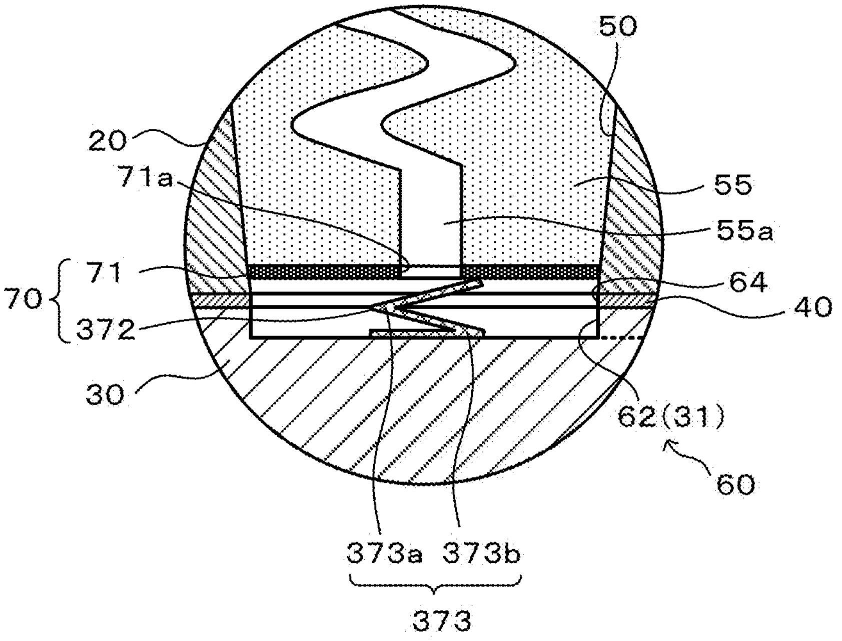
FIG. 12 is a partially enlarged sectional view that shows a plate spring 372.

In the above-described embodiment, the plate spring 72 is disposed in a state of being extended in the lateral direction perpendicular to the up and down direction when pressed by the dense plug 55 from above; however, the configuration is not limited thereto. The plate spring 72 does not need to be extended in the lateral direction. For example, zigzag folding directions of a plate spring 372 shown in FIG. 12 are in the lateral direction, and the plate spring 372 has a plurality of (here, two) folded parts 373 folded in the horizontal direction. The plate spring 372 has one or more (here, one) first folded parts 373*a* folded rightward and one or more (here, one) second folded parts 373*b* folded leftward as the plurality of folded parts 373. For this reason, the extension and contraction direction of the plate spring 372 is the up and down direction, that is, a direction to press the dense plug 55. In other words, the plate spring 372 is disposed vertically. Since the 1 plate spring 372 can also press the dense plug 55 upward with elastic force, continuity from a contact part of the electrically conductive gas passage part 70 with the dense plug 55 (here, the top surface of the coating layer 71) to the electrically conductive plate 30 is easily maintained. In the above-described embodiment, each of the folded parts 73 of the plate spring 72 is formed in a V-shape; however, the configuration is not limited thereto. For example, the wafer placement table 10 may include a plate spring 472 shown in FIG. 13 instead of the plate spring 72. The plate spring 472 has a plurality of folded parts 473 folded in the up and down direction. The plate spring 472 has one or more (here, multiple and specifically four) first folded parts 473*a* folded downward and one or more (here, multiple and specifically three) second folded parts 473*b* folded upward as the plurality of folded parts 473. For this reason, the number of times of folding of the plate spring 472 is seven. Each of the first folded parts 473*a* has a first plate-like part 475 that extends in the horizontal direction and of which the top surface makes up a top surface 472*a* of the plate spring 472. Each of the second folded parts 473*b* has a second plate-like part 476 that extends in the horizontal direction and of which the bottom surface makes up a bottom surface 472*b* of the plate spring 472. For this reason, each of the plurality of folded parts 473 of the plate spring 472 does not have a V-shape and has such a shape having an upper base part of a trapezoid and oblique sides on both sides thereof. The plate spring 472 shown in FIG. 13, as in the case of the plate spring 72, is disposed in a state of being extended in the lateral direction perpendicular to the up and down direction when pressed by the dense plug 55 from above. Since the plate spring 472 has the first plate-like parts 475, the width of the top surface 472*a* in the horizontal direction is, for example, easily widened as compared to the top surface 72*a* of the plate spring 72 of FIG. 2. For this reason, it is possible to increase the contact area between the top surface 472*a* and a member above the plate spring 472 (here, the coating layer 71). Similarly, since the plate spring 472 has the second plate-like parts 476, the width of the bottom surface 472*b* in the horizontal direction is, for example, easily widened as compared to the bottom surface 72*b* of the plate spring 72 of FIG. 2. For this reason, it is possible to increase the contact area between the bottom surface 472*b* and a member below the plate spring 472 (here, the electrically conductive plate 30). With these configurations, it is possible to further reliably bring the plate spring 472 into contact with the upper and lower members, and, by extension, it is possible to further reliably maintain continuity from the contact part of the electrically conductive gas passage part 70 with the dense plug 55 to the electrically conductive plate 30. Since the contact area between the plate spring 472 and its upper and lower members is large, it is possible to reduce contact resistance, so the effect of reducing discharge around the bottom end of the dense plug 55 increases. The plate spring 72 of the above-described embodiment is regarded as having such a shape that the first plate-like parts 475 and the second plate-like parts 476 are omitted from the plate spring 472.

Figure 13:
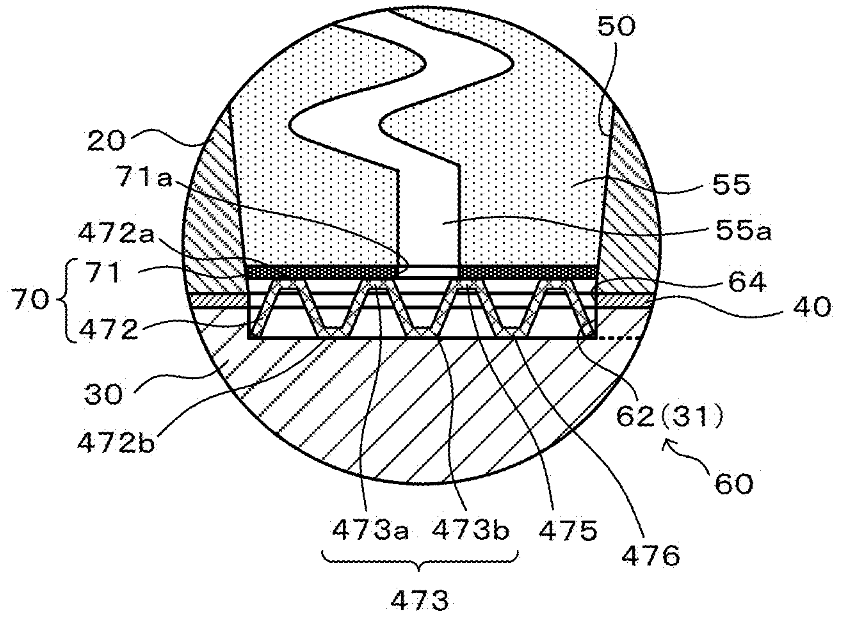
FIG. 13 is a partially enlarged sectional view that shows a plate spring 472.
Figure 14:
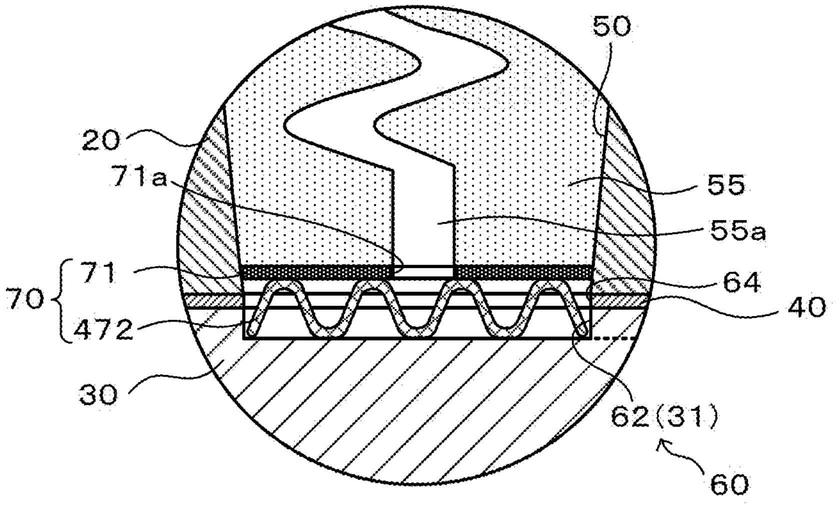
FIG. 14 is a partially enlarged sectional view that shows another mode of the plate spring 472.

In the plate spring 472 shown in FIG. 13, edge portions of the plate spring 472 may be formed in a curved surface shape as shown in FIG. 14. With this configuration, it is possible to avoid electric field concentration at the edge portions of the plate spring 472, so it is possible to further reduce discharge around the bottom end of the dense plug 55. In the plate spring 72 or the plate spring 372 as well, edge portions may be similarly formed in a curved surface shape.

Figure 15:
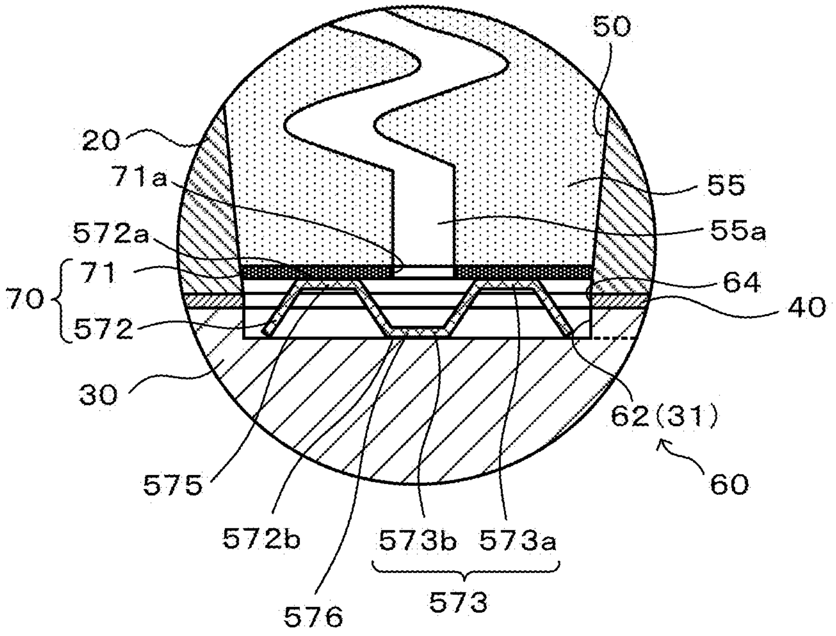
FIG. 15 is a partially enlarged sectional view that shows a plate spring 572.

The number of times of folding of each of the plate spring 72 shown in FIG. 2 and the plate spring 472 shown in FIG. 13 is seven; however, the configuration is not limited thereto. The number of times of folding of a plate spring just needs to be one or more, and the number of times of folding may be multiple. For example, a plate spring 572 shown in FIG. 15 is the one in which the number of times of folding of the plate spring 472 is changed to three. The plate spring 572 has a plurality of folded parts 573 folded in the up and down direction. The plate spring 572 has two first folded parts 573*a* folded downward and one second folded part 573*b* folded upward as the plurality of folded parts 573. Each of the first folded parts 573*a* has a first plate-like part 575 that extends in the horizontal direction and of which the top surface makes up a top surface 572*a* of the plate spring 572. The second folded part 573*b* has a second plate-like part 576 that extends in the horizontal direction and of which the bottom surface makes up a bottom surface 572*b* of the plate spring 572. The plate spring 572 shown in FIG. 15, as in the case of the plate spring 72, is disposed in a state of being extended in the lateral direction perpendicular to the up and down direction when pressed by the dense plug 55 from above. When the number of times of folding is reduced as in the case of the plate spring 572, the volume of the plate spring is easily reduced. When the volume is reduced, the plate spring 572 is less likely to interfere with flow of gas in the gas introduction passage 60.

Figure 16:
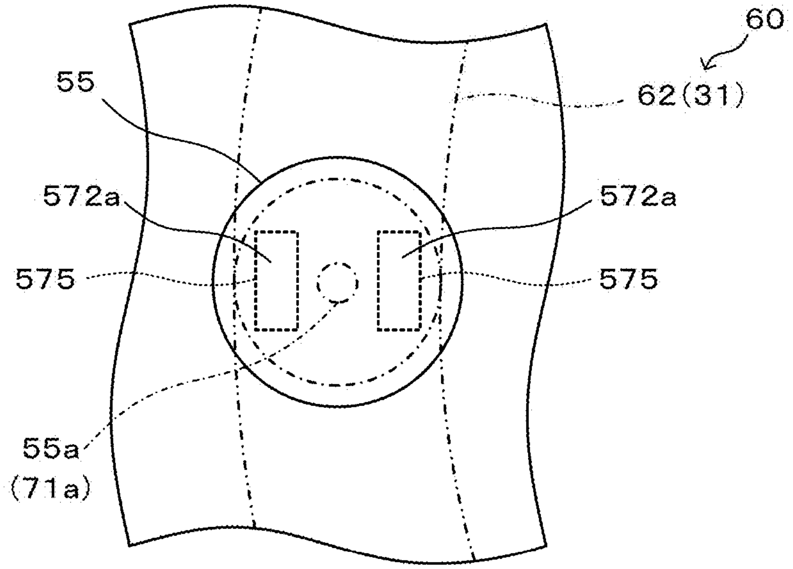
FIG. 16 is a view that shows the positions of a top surface 572*a* of the plate spring 572 and gas internal flow channel 55*a* in a plan view.
Figure 17:
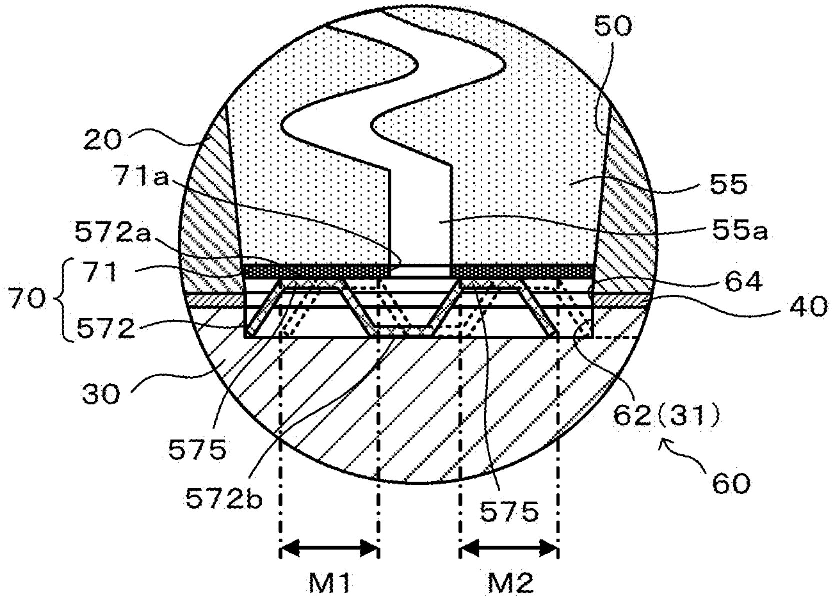
FIG. 17 is a view that shows a moving range of the plate spring 572 in a horizontal direction.

In the above-described embodiment, at least one of the shape and arrangement position of the plate spring 72 is adjusted so that the hole 71*a* of the coating layer 71 (and the opening of the bottom end of the gas internal flow channel 55*a*) is not completely closed to block flow of gas. In this case, the plate spring 72 may close part of the hole 71*a* of the coating layer 71, that is, the top surface 72*a* of the plate spring 72 may overlap part of the hole 71*a* in a plan view. However, in a plan view, the top surface 72*a* of the plate spring 72 preferably completely does not overlap any part of the hole 71*a*. There can be a positional shift of the plate spring 72 in the horizontal direction in the gas introduction passage 60. Therefore, the opening of the bottom end of the gas internal flow channel 55*a* is located outside a moving range of the top surface 72*a* of the plate spring 72 resulting from a positional shift in the gas introduction passage 60 in a plan view. The same applies to the plate springs 372, 472, 572. This will be described in detail by way of the plate spring 572 as an example. FIG. 16 is a view that shows the positions of the top surface 572*a* of the plate spring 572 and gas internal flow channel 55*a* in a plan view. FIG. 17 is a view that shows a moving range of the plate spring 572 in the horizontal direction. In FIG. 16, the outline of the top surface 572*a* of the plate spring 572 (that is, the outline of the first plate-like parts 575) is indicated by the dashed line, the outline of the lower end surface of the dense plug 55 and the outline of the opening of the bottom end of the gas internal flow channel 55*a* are indicated by the alternate long and short-dashed line, and the outline of the gas introduction passage 60 (more specifically, the recessed groove 31 of the gas second passage 62) is indicated by the alternate long and 2 short-dashed line. The outline of the opening of the bottom end of the gas internal flow channel 55*a* and the outline of the opening of the hole 71*a* of the coating layer 71 are at the same position in a plan view. In FIG. 17, the plate spring 572 in a state located at the leftmost position in the recessed groove 31 is indicated by the continuous line, and the plate spring 572 in a state located at the rightmost position in the recessed groove 31 is indicated by the dashed line. In the state shown in FIG. 16, the top surface 572*a* of the plate spring 572 does not overlap the opening of the bottom end of the gas internal flow channel 55*a*, but, when a positional shift of the plate spring 572 occurs in the recessed groove 31 of the gas introduction passage 60, the position of the top surface 572*a* also changes. However, as shown in FIG. 17, the opening of the bottom end of the gas internal flow channel 55*a* (and the hole 71*a*) does not overlap the moving ranges M1, M2 resulting from a positional shift of the top surface 572*a* in the recessed groove 31 and is located outside the moving ranges M1, M2. Therefore, even when how much a right or left positional shift of the plate spring 572 occurs, the top surface 572*a* does not overlap the opening of the bottom end of the gas internal flow channel 55*a* (and the hole 71*a*) in a plan view. In FIG. 17, only the moving ranges M1, M2 of the top surface 572*a* resulting from right and left positional shifts of the plate spring 572 are shown. However, the opening of the bottom end of the gas internal flow channel 55*a* (and the hole 71*a*) is preferably configured to be located outside the moving range of the top surface 572*a* resulting from the positional shift even when there occurs any positional shift in the horizontal direction (including rotation in the horizontal direction). For example, by reducing a difference between the right and left width of the plate spring 572 and the right and left width of the recessed groove 31 or reducing the opening diameter of the bottom end of the ceramic plate penetrating part 50, a moving range at the top end side of the plate spring 572 is restricted by the opening diameter. Thus, the opening of the bottom end of the gas internal flow channel 55*a* (and the hole 71*a*) can be configured to be located outside the moving range of the top surface 572*a* resulting from a positional shift. Thus, even when there occurs a positional shift of the plate spring 572 in the gas introduction passage 60, the top surface 572*a* of the plate spring 572 does not overlap the opening of the bottom end of the gas internal flow channel 55*a* in a plan view, so the plate spring 572 is less likely to interfere with flow of gas between the gas introduction passage 60 and the gas internal flow channel 55*a*.

Figure 18:
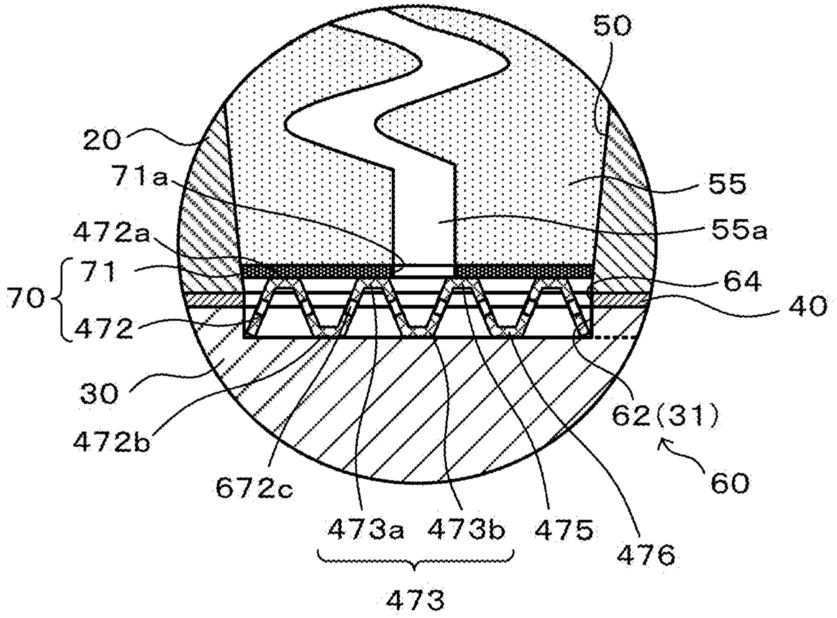
FIG. 18 is a partially enlarged sectional view that shows an example of the plate spring 472 having holes 672*c*.
Figure 19:
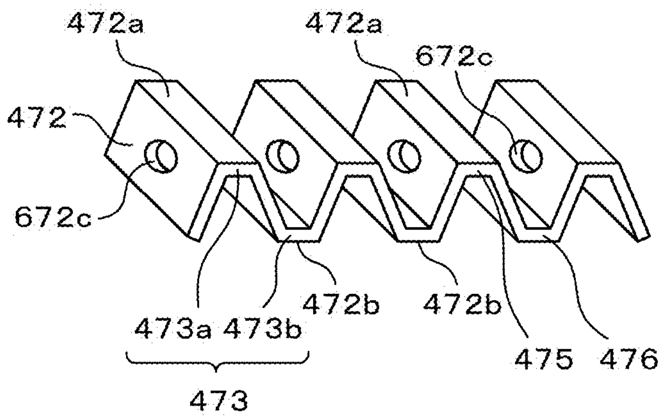
FIG. 19 is a perspective view of the plate spring 472 of FIG. 18.

Each of the above-described plate springs 72, 372, 472, 572 may be configured to have a hole that allows passage of gas. For example, in the example shown in FIGS. 18 and 19, holes 672*c* that allow passage of gas are provided at plate-like parts of the plate spring 472, inclined with respect to the up and down direction. Thus, the plate spring 472 is less likely to interfere with flow of gas, so gas further easily passes through the electrically conductive gas passage part 70.

In each of the above-described plate springs 72, 372, 472, 572, an insertion hole for inserting a member for holding a plate spring, such as tweezers, at the time of replacement of the plate spring may be provided. The number of the holes may be two or more. The hole that allows passage of gas like the holes 672*c* shown in FIGS. 18 and 19 may also serve as the insertion hole.

In the above-described embodiment, the plate spring 72 has such a shape that a metal plate is folded in a zigzag shape; however, the configuration is not limited thereto. For example, the plate spring 72 may be a U-shaped plate spring.

In the above-described embodiment, each gas second passage 62 has the recessed groove 31 (first recessed portion) provided on the top surface of the electrically conductive plate 30 and formed by disposing the bottom surface (flat surface) of the electrically conductive bonding layer 40 on the recessed groove 31; however, the configuration is not limited thereto. For example, each gas second passage 62 may have a recessed groove (second recessed portion) provided on the bottom surface of the electrically conductive bonding layer 40, and the top surface (flat surface) of the electrically conductive plate 30 may be disposed under the recessed groove. Alternatively, the electrically conductive bonding layer 40 may have a top and bottom two-layer structure, a groove (a groove extending through in the up and down direction) that will be finally the gas second passage 62 may be provided in the bottom layer, and the above-described bonding layer penetrating part 64 may be provided in the top layer. In this case as well, when the electrically conductive gas passage part 70 is provided inside the gas introduction passage 60 (bonding layer penetrating part 64) and the electrically conductive gas passage part 70 is provided so as to be in contact with the bottom surface of the dense plug 55 and is electrically continuous with the electrically conductive plate 30, it is possible to reduce discharge in an area around the electrically conductive plate 30-side end of the dense plug 55.

In the above-described embodiment, the gas second passage 62 and the gas auxiliary passage 63 may be omitted, and the plurality of gas first passages 61 and the plurality of ceramic plate penetrating parts 50 may communicate in a one-to-one correspondence with each other.

In the above-described embodiment, the top surface of the dense plug 55 has the same level as the reference surface 21*c* of the wafer placement surface 21; however, the configuration is not limited thereto. For example, a difference obtained by subtracting the height of the top surface of the dense plug 55 from the height of the reference surface 21*c* of the wafer placement surface 21 may be less than or equal to 0.5 mm (preferably less than or equal to 0.2 mm, more preferably less than or equal to 0.1 mm). In other words, the top surface of the dense plug 55 may be disposed at a position lower by 0.5 mm or less (preferably 0.2 mm or less, more preferably 0.1 mm or less) than the reference surface 21*c* of the wafer placement surface 21. With this configuration as well, the height of the space between the bottom surface of a wafer W and the top surface of the dense plug 55 is suppressed to a relatively low height. Therefore, it is possible to prevent occurrence of glow discharge and, by extension, arc discharge in this space.

In the above-described embodiment, the ceramic plate 20 and the electrically conductive plate 30 are joined by the electrically conductive bonding layer 40. Alternatively, a non-bonding layer, such as a resin bonding layer, may be used instead of the electrically conductive bonding layer 40. In this case, a metal, such as Al and Ti, may be used as the electrically conductive plate. When the electrically conductive bonding layer 40 is a resin bonding layer, the ceramic plate 20 and the electrically conductive plate 30 may be bonded via the resin bonding layer while being applied with pressure in an autoclave.

In the above-described embodiment, the electrostatic electrode is incorporated in the ceramic plate 20 as the electrode 22. Instead of or in addition to this, a heater electrode (resistance heating element) may be incorporated. In this case, a heater power supply is connected to the heater electrode. The ceramic plate 20 may incorporate one layer of electrode or may incorporate two or more layers of electrode with a gap.

In the above-described embodiment, lift pin holes extending through the wafer placement table 10 may be provided. The lift pin holes are holes for allowing insertion of lift pins used to raise and lower a wafer W with respect to the wafer placement surface 21. The lift pin holes are provided at three locations when a wafer W is supported by, for example, three lift pins.

In the above-described embodiment, the ceramic plate 20 is made by firing a ceramic powder molded body by hot pressing. The molded body at that time may be made by laminating a plurality of tape molds, or may be made by mold casting, or may be made by compacting ceramic powder.

In the above-described embodiment, the dense plug 55 is fixed by being press-fitted to the ceramic plate penetrating part 50; however, the configuration is not limited thereto. For example, the outer peripheral surface of the dense plug 55 and the inner peripheral surface of the ceramic plate penetrating part 50 may be bonded to each other, or an external thread portion provided on the outer peripheral surface of the dense plug 55 may be screwed to an internal thread portion provided on the inner peripheral surface of the ceramic plate penetrating part 50.

Figure 20:
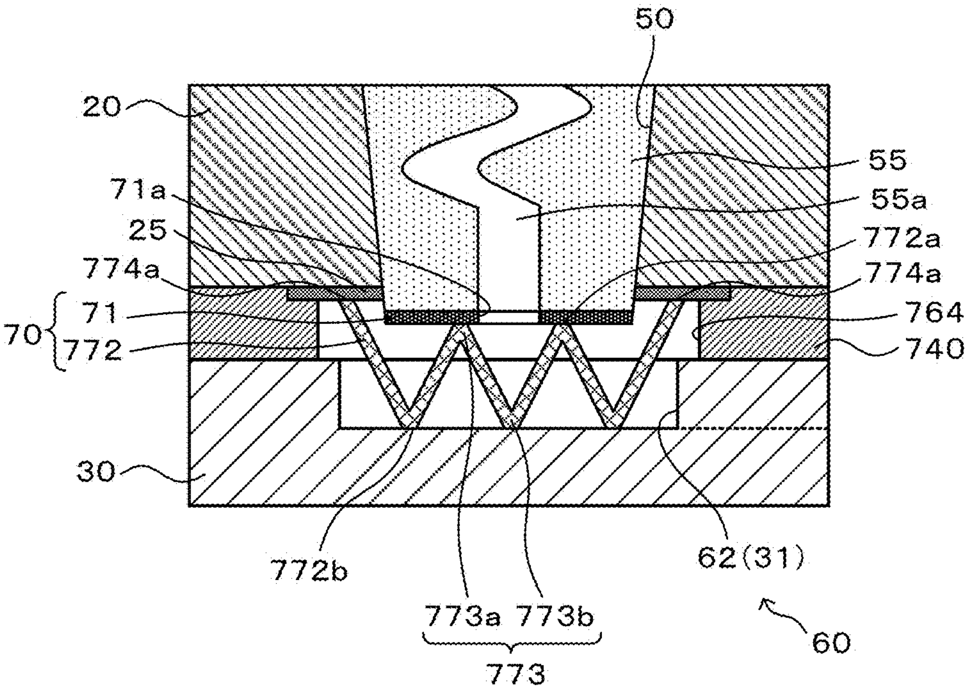
FIG. 20 is a partially enlarged sectional view that shows an electric conductor layer 25 and a plate spring 772.

The enlarged sectional view of FIG. 2 shows that the diameter of the bonding layer penetrating part 64 is the same as the diameter of the opening of the bottom of the ceramic plate penetrating part 50. Alternatively, as described above, the diameter of the bonding layer penetrating part 64 may be greater than the diameter of the opening of the bottom of the ceramic plate penetrating part 50. In this case, a mode shown in FIG. 20 may be adopted. In FIG. 20, the wafer placement table 10 includes an electrically insulating bonding layer 740 having no electrical conductivity (having electrically insulating properties), such as a resin bonding layer, instead of the electrically conductive bonding layer 40. Examples of the resin used for the electrically insulating bonding layer 740 include silicone resin, acrylic resin, polyimide resin, and epoxy resin. A plate spring 772 is provided instead of the plate spring 72. In the electrically insulating bonding layer 740, a bonding layer penetrating part 764 that is a hole extending through the electrically insulating bonding layer 740 in the up and down direction is formed. The bonding layer penetrating part 764 is part of the gas introduction passage 60 and is a gas passage extending from the gas second passage 62 to the hole 71*a* of the coating layer 71. As shown in FIG. 20, the diameter of the bonding layer penetrating part 764 is greater than the diameter of the opening of the bottom of the ceramic plate penetrating part 50. For this reason, part of the bottom surface of the ceramic plate 20 (an area around the opening of the ceramic plate penetrating part 50) is located just above the bonding layer penetrating part 764 and is disposed so as to be exposed to the bonding layer penetrating part 764 in the gas introduction passage 60. However, in FIG. 20, the electric conductor layer 25 is disposed so as to coat a part of the bottom surface of the ceramic plate 20, exposed to the bonding layer penetrating part 764. For this reason, the bottom surface of the ceramic plate 20 is not exposed to the bonding layer penetrating part 764 because of the presence of the bonding layer penetrating part 764. The electric conductor layer 25 has a diameter greater than the bonding layer penetrating part 764 in a top view, and part of the electric conductor layer 25 is sandwiched between the bottom surface of the ceramic plate 20 and the top surface of the electrically insulating bonding layer 740 as shown in FIG. 20. The electric conductor layer 25 just needs to be an electric conductor, and the same material (for example, a metal material) as the material of the above-described coating layer 71 may be used. The electric conductor layer 25, as in the case of the coating layer 71, may be a layer formed in advance on the bottom surface of the ceramic plate 20 by sputtering, electroless plating, or the like. The plate spring 772 has two first folded parts 773*a* folded downward and three second folded parts 773*b* folded upward as the plurality of folded parts 773. The plate spring 772, as in the case of the plate spring 72, is disposed in a state of being extended in the lateral direction perpendicular to the up and down direction when pressed by the dense plug 55 from above. The plate spring 772, as in the case of the plate spring 72, provides electrical continuity between the coating layer 71 and the electrically conductive plate 30 in a manner such that a top surface 772*a* of the first folded parts 773*a* is in contact with the bottom surface of the coating layer 71 and a bottom surface 772*b* of the second folded parts 773*b* is in contact with the electrically conductive plate 30. Furthermore, the plate spring 772 is also in contact with the electric conductor layer 25. Specifically, top surfaces 774*a* of two plate-like members located at both right and left ends of the plate spring 772 each are in contact with the bottom surface of the electric conductor layer 25. In this way, in FIG. 20, a part of the bottom surface of the ceramic plate 20, exposed to the bonding layer penetrating part 764 of the gas introduction passage 60, is coated with the electric conductor layer 25, and the electric conductor layer 25 is in contact with the plate spring 772 to be electrically continuous with the electrically conductive plate 30 via the plate spring 772. For this reason, a potential difference is less likely to occur around a part of the bottom surface of the ceramic plate 20, facing the inside of the gas introduction passage 60 (a part of the bottom surface of the ceramic plate 20, located just above the bonding layer penetrating part 764 in FIG. 20). Therefore, it is possible to reduce discharge around a part of the bottom surface of the ceramic plate 20, facing the inside of the gas introduction passage 60.

In FIG. 20, different from FIG. 2, the bottom end of the dense plug 55 projects downward beyond the bottom surface of the ceramic plate 20. In order for the plate spring 772 of FIG. 20 to be reliably in contact with the electric conductor layer 25 in such a case, the length of each of the two plate-like members located at both right and left ends is longer than each of the four plate-like members at the other positions. However, even when the plurality of (here, six) plate-like members all have the same length, only the plate-like members of parts of the plate spring 772, pressed against the dense plug 55, have a smaller height (an inclination angle of the plate-like members with respect to the up and down direction is increased). Thus, the top surfaces 774*a* of the plate-like members not pressed against the dense plug 55 (here, the two plate-like members located at both right and left ends) can be brought into contact with the electric conductor layer 25.

In FIG. 20, the plate spring 772 is in contact with both the coating layer 71 and the electric conductor layer 25 to provide electrical continuity between these members and the electrically conductive plate 30. Alternatively, a conduction member that provides electrical continuity between the electric conductor layer 25 and the electrically conductive plate 30 may be provided in the wafer placement table 10 separately from the plate spring 772. For example, in the example shown in FIG. 21, the wafer placement table 10 includes a plate spring 872 instead of the plate spring 772 of FIG. 20 and further includes a conduction member 875. The plate spring 872 has one first folded part 873*a* folded downward and two second folded parts 873*b* folded upward as the plurality of folded parts 873. The plate spring 872, as in the case of the plate spring 772, is disposed in a state of being extended in the lateral direction perpendicular to the up and down direction when pressed by the dense plug 55 from above. The plate spring 872, as in the case of the plate spring 772, is configured such that a top surface 872*a* of the first folded part 873*a* is in contact with the bottom surface of the coating layer 71 and a bottom surface 872*b* of the second folded parts 873*b* is in contact with the electrically conductive plate 30. The plate spring 872, different from the plate spring 772, is configured such that top surfaces 874*a* of the two plate-like members located at both right and left ends are also in contact with the bottom surface of the coating layer 71. With these configurations, the plate spring 872 provides electrical continuity between the coating layer 71 and the electrically conductive plate 30. On the other hand, the plate spring 872 is not in contact with the electric conductor layer 25. The conduction member 875 is an electrically conductive elastic body and is configured as a coil spring in FIG. 21. The same material (for example, a metal material) as the material of the above-described plate spring 72 may be used as the material of the conduction member 875. The conduction member 875 is disposed in the gas introduction passage 60 such that the axial direction of the coil is aligned in the up and down direction, a top end is in contact with the bottom surface of the electric conductor layer 25, and a bottom end is in contact with the electrically conductive plate 30. With this configuration, the conduction member 875 provides electrical continuity between the electric conductor layer 25 and the electrically conductive plate 30. The plate spring 872 is disposed inside the coil of the conduction member 875. In other words, the plate spring 872 is surrounded by the conduction member 875 in a top view. The conduction member 875 has an extension and contraction direction in the up and down direction and is disposed in the gas introduction passage 60 in a state contracted from a natural length. For this reason, the conduction member 875 presses the electric conductor layer 25 upward with elastic force. Similarly, the conduction member 875 presses the electrically conductive plate 30 downward with elastic force. In this way, even when the conduction member 875 provided separately from the plate spring 872 provides electrical continuity between the electric conductor layer 25 and the electrically conductive plate 30, it is possible to reduce discharge around a part of the bottom surface of the ceramic plate 20, facing the inside of the gas introduction passage 60 as in the case of the mode of FIG. 20. The conduction member 875 presses the electric conductor layer 25 upward with elastic force, so electrical continuity from the electric conductor layer 25 to the electrically conductive plate 30 is easily maintained.

The conduction member 875 is not limited to a coil spring as long as the conduction member 875 is an elastic body. For example, the conduction member 875 may be a plate spring that is a member different from the plate spring 872. However, a coil spring rather than a plate spring allows gas to easily pass in the axial direction of the coil, any gap between the wires, and the like. When the plate spring 872 is disposed inside the coil of the conduction member 875, the plate spring 872 and the conduction member 875 can be disposed compactly in the gas introduction passage 60. For this reason, when the conduction member 875 is used as a member different from the plate spring 872, the conduction member 875 is preferably a coil spring. The conduction member 875 just needs to be an electrically conductive member even when the conduction member 875 is not an elastic body. However, since electrical continuity between the electric conductor layer 25 and the electrically conductive plate 30 is easily maintained as described above, the conduction member 875 is preferably an elastic body.

Figure 21:
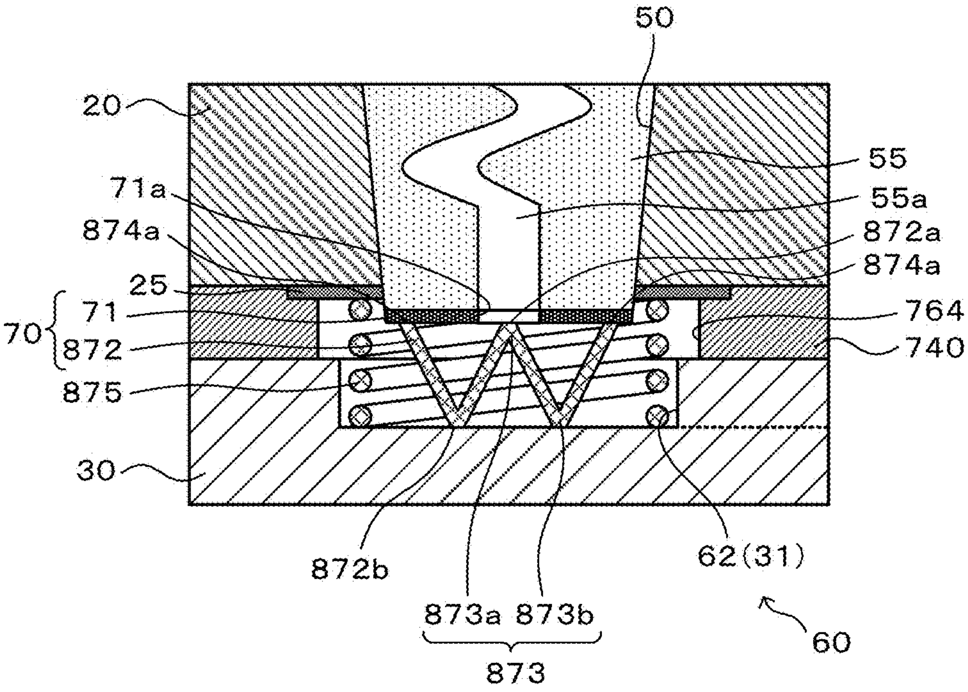
FIG. 21 is a partially enlarged sectional view that shows a conduction member 875.

When the lower end surface of the dense plug 55 is located at the same level or the level close to the bottom surface of the ceramic plate 20 in FIGS. 20 and 21, the electric conductor layer 25 and the coating layer 71 contact with each other to be electrically continuous with each other. Therefore, in this case, even when the plate spring 772 or the conduction member 875 is not in contact with the electric conductor layer 25, it is possible to provide electrical continuity between the electric conductor layer 25 and the electrically conductive plate 30. When the wafer placement table 10 is manufactured, before the ceramic plate 20 and the electrically conductive plate 30 are bonded to each other, the dense plug 55 may be inserted into the ceramic plate 20 such that the lower end surface of the dense plug 55 is located at the same level or the level close to the bottom surface of the ceramic plate 20 to integrally form the coating layer 71 and the electric conductor layer 25. However, there can be a case where the coating layer 71 and the electric conductor layer 25 cannot contact with each other due to a deviation of an insertion position of the dense plug 55, so the plate spring 772 is preferably in contact with the electric conductor layer 25 as shown in FIG. 20.

In FIGS. 20 and 21, the electric conductor layer 25 coats the entire part of the bottom surface of the ceramic plate 20, exposed to the bonding layer penetrating part 764; however, the configuration is not limited thereto. The electric conductor layer 25 may coat only part of that. However, it is preferable to coat the entire part as in the case of FIGS. 20 and 21.

Figure 22:
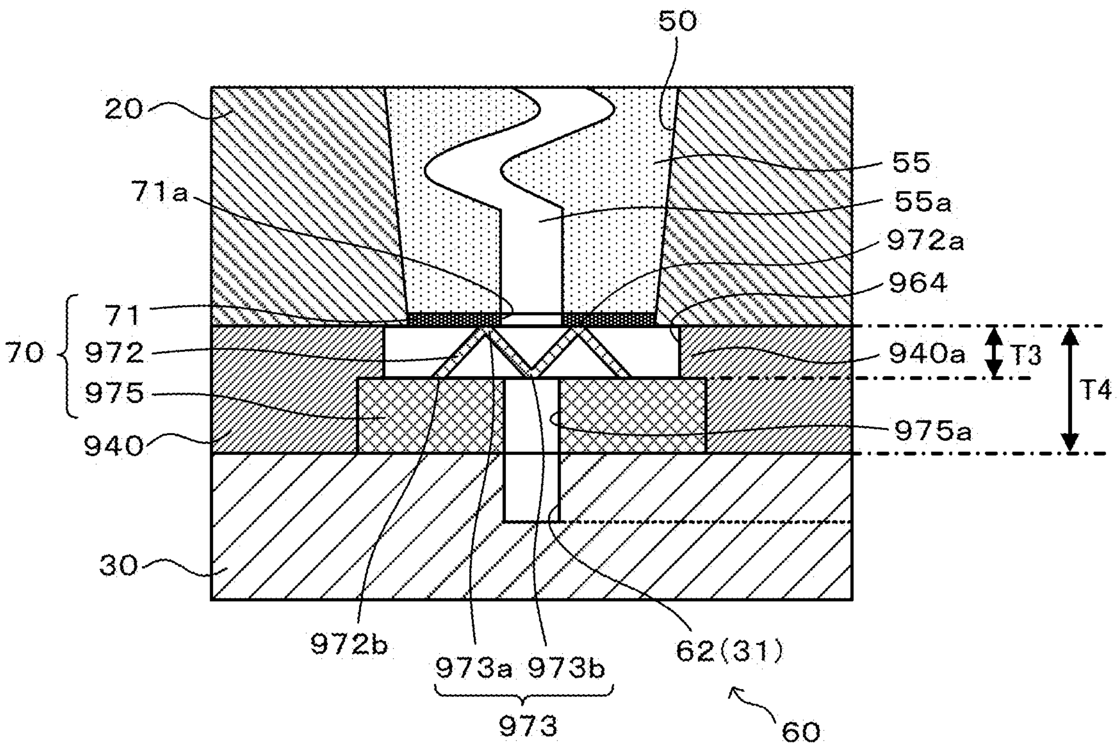
FIG. 22 is a partially enlarged sectional view that shows a gas passage member 975.

In the above-described embodiment, the electrically conductive gas passage part 70 includes the coating layer 71 and the plate spring 72, and the plate spring 72 is in direct contact with the electrically conductive plate 30 to provide electrical continuity; however, the configuration is not limited thereto. For example, the electrically conductive gas passage part 70 may have a gas passage member that provides electrical continuity between the electrically conductive plate 30 and the plate spring 72. FIG. 22 is a partially enlarged sectional view that shows a gas passage member 975. The electrically conductive gas passage part 70 of FIG. 22 has the coating layer 71, a plate spring 972, and the gas passage member 975. In FIG. 22, an electrically insulating bonding layer 940 made of a similar material to that of the electrically insulating bonding layer 740 of FIG. 20 bonds the ceramic plate 20 with the electrically conductive plate 30. In the electrically insulating bonding layer 940, a bonding layer penetrating part 964 that is a hole extending through the electrically insulating bonding layer 940 in the up and down direction is formed. The bonding layer penetrating part 964 is part of the gas introduction passage 60. The plate spring 972 has two first folded part **973*a* folded downward and one second folded part 973*b* folded upward as the plurality of folded parts 973. The plate spring 972, as in the case of the plate spring 72, is disposed in a state of being extended in the lateral direction perpendicular to the up and down direction when pressed by the dense plug 55 from above. The plate spring 972 is configured such that a top surface 972*a* is in contact with the bottom surface of the coating layer 71 and a bottom surface 972*b* is in contact with the top surface of the gas passage member 975. The gas passage member 975 is an electrically conductive member and allows passage of gas between the dense plug 55 and the gas second passage 62. The gas passage member 975 is, for example, a substantially circular columnar member having a circular shape in a top view. The gas passage member 975 is configured such that the top surface is in contact with the bottom surface 972*b* of the plate spring 972 and the bottom surface is in contact with the top surface of the electrically conductive plate 30. With this configuration, the gas passage member 975 provides electrical continuity between the plate spring 972 and the electrically conductive plate 30. The gas passage member 975 has a hole 975*a* extending through the gas passage member 975 in the up and down direction. Gas in the gas second passage 62 can pass through the hole 975*a* and the bonding layer penetrating part 964 and reach the hole 71*a* of the coating layer 71. Examples of the material of the gas passage member 975 include a metal. The material of the gas passage member 975 is preferably a low-resistance non-magnetic body. A material having a coefficient of thermal expansion close to those of the ceramic plate 20 and electrically conductive plate 30 is preferably selected as the material of the gas passage member 975. A specific example of the material of such the gas passage member 975 is Ti or the like. The gas passage member 975 may be a member independent of the electrically conductive plate 30 or may be a film formed on the top surface of the electrically conductive plate 30. Even when the electrically conductive gas passage part 70 has the gas passage member 975 in this way, it is possible to reduce discharge around the electrically conductive plate 30-side end of the dense plug 55, that is, the bottom end of the dense plug 55** as in the case of the above-described embodiment.

Since the gas passage member 975 is present, part of the bonding layer penetrating part 964 is occupied by the gas passage member 975 as shown in FIG. 22, so it is possible to reduce the height T3 of a space part of the bonding layer penetrating part 964 with respect to the thickness T4 of the electrically insulating bonding layer 940 (that is, the height of the overall bonding layer penetrating part 964). Thus, it is possible to reduce discharge in the bonding layer penetrating part 964. The thickness T3 is, for example, preferably less than or equal to 0.2 mm and more preferably less than or equal to 0.1 mm. It is possible to reduce discharge by reducing the height T3 with the presence of the gas passage member 975 in this way, so the electric conductor layer 25 is not provided at the exposed part of the bottom surface of the ceramic plate 20 in FIG. 22 different from FIG. 20. With the result that it is possible to reduce discharge in the bonding layer penetrating part 964 even without providing the electric conductor layer 25. Of course, the electric conductor layer 25 may be provided on the bottom surface of the ceramic plate 20 as in the case of FIG. 20. It is possible to reduce discharge by reducing the height T3 with the presence of the gas passage member 975, so it is easy to achieve both a reduction of discharge and an increase in the thermal resistance of the electrically insulating bonding layer 940 by increasing the thickness T4 of the electrically insulating bonding layer 940. By increasing the thermal resistance of the electrically insulating bonding layer 940, it is possible to suppress cooling of wafer W by reducing heat transfer from the ceramic plate 20 to the electrically conductive plate 30. By suppressing cooling of wafer W, it is possible to, for example, further increase the temperature of the wafer W. Generally, an electric conductor has a lower thermal resistance than an insulator, so the ceramic plate 20 and the electrically conductive plate 30 are preferably bonded not by the electrically conductive bonding layer 40 but by the electrically insulating bonding layer 940 from the viewpoint of increasing the thermal resistance.

Figure 23A:
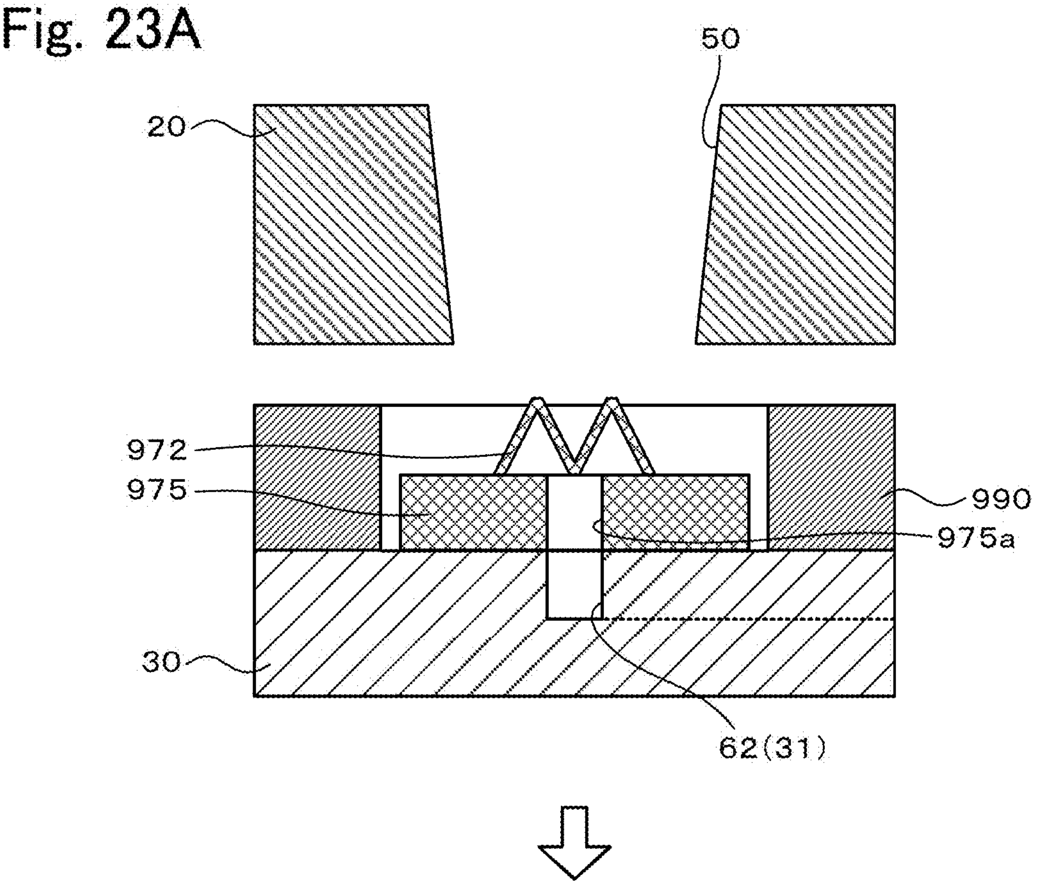
FIGS. 23A and 23B are views that show a state of joining a ceramic plate 20 with an electrically conductive plate 30 with an electrically insulating bonding layer 940.
Figure 23B:
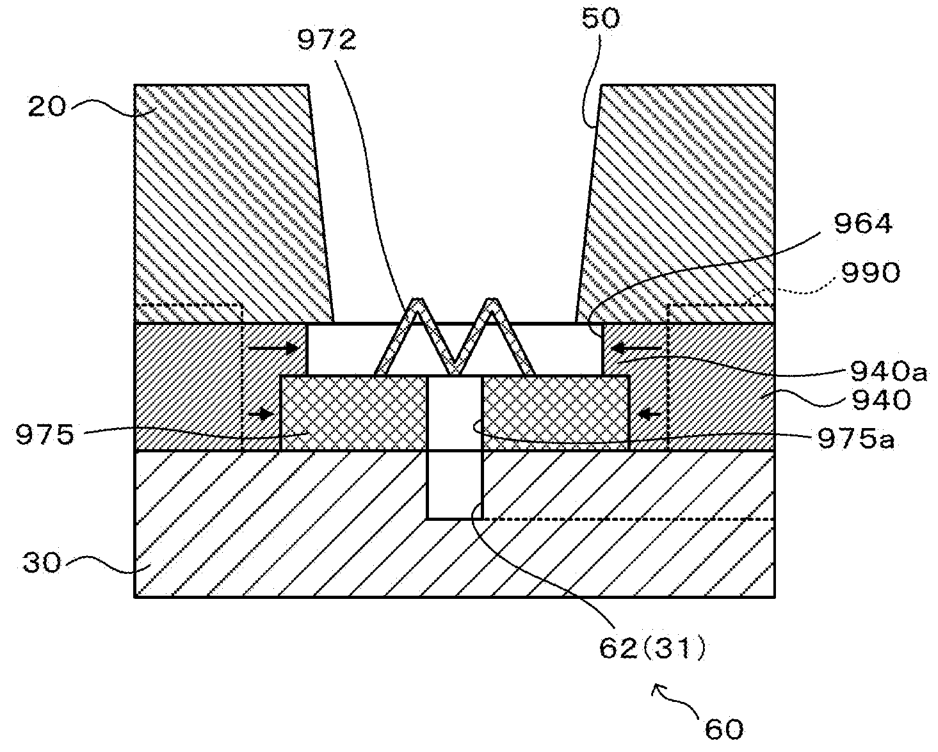

When discharge in the bonding layer penetrating part 964 is reduced by occupying part of the bonding layer penetrating part 964 with the gas passage member 975, a gap (space) between the side surface of the gas passage member 975 (the right and left surfaces in FIG. 22) and the electrically insulating bonding layer 940 is preferably small. The side surface of the gas passage member 975 is more preferably in contact with the electrically insulating bonding layer 940, and, as shown in FIG. 22, it is further preferable that the entire side surface of the gas passage member 975 is in contact with the electrically insulating bonding layer 940 with no gap. In FIG. 22, part of the electrically insulating bonding layer 940 covers part of the top surface of the gas passage member 975 to serve as a projecting part 940*a*. For this reason, the diameter of a space part above the gas passage member 975 in the bonding layer penetrating part 964 is less than the diameter of the gas passage member 975. With the presence of the projecting part 940*a*, even when there is a gap at part of the side surface of the gas passage member 975, it is possible to separate the gap from a space above the gas passage member 975 in the bonding layer penetrating part 964. With this configuration as well, it is possible to reduce discharge. For example, by using the fact that the electrically insulating bonding layer 940 crushes at the time of bonding the ceramic plate 20 with the electrically conductive plate 30, it is possible to provide a state where there is no gap between the side surface of the gas passage member 975 and the electrically insulating bonding layer 940 or form the projecting part 940*a*. FIGS. 23A and 23B are views that show a state of joining the ceramic plate 20 with the electrically conductive plate 30 with the electrically insulating bonding layer 940. At the time of manufacturing the wafer placement table 10, as shown in FIG. 23A, a sheet electrically insulating bonding material 990 is disposed on the top surface of the electrically conductive plate 30 (or the MMC disk member 81), and the gas passage member 975 and the plate spring 972 are disposed in a through-hole formed in advance in the electrically insulating bonding material 990. A through-hole of the electrically insulating bonding material 990 is formed to have a larger diameter than a final diameter of the bonding layer penetrating part 964 of the electrically insulating bonding layer 940. In this state, as shown in FIG. 23A, a gap may be provided between the side surface of the gas passage member 975 and the electrically insulating bonding material 990. After the gas passage member 975 and the plate spring 972 are disposed in this way, the electrically insulating bonding material 990 is sandwiched by the ceramic plate 20 and the electrically conductive plate 30, and the electrically insulating bonding material 990 is applied with pressure while being heated. Thus, the ceramic plate 20 and the electrically conductive plate 30 are bonded by the electrically insulating bonding material 990. Thus, the electrically insulating bonding material 990 becomes the electrically insulating bonding layer 940 (FIG. 23B). After that, the state of FIG. 22 is established by attaching the dense plug 55. The electrically insulating bonding material 990 is crushed with pressure applied from above and below at the time of bonding the ceramic plate 20 with the electrically conductive plate 30, so a through-hole of the electrically insulating bonding material 990, in which the gas passage member 975 is disposed, narrows to become the bonding layer penetrating part 964. Thus, it is possible to establish a state where the side surface of the gas passage member 975 is in contact with the electrically insulating bonding layer 940, so it is possible to eliminate a gap between the side surface of the gas passage member 975 and the electrically insulating bonding layer 940. When the through-hole of the electrically insulating bonding material 990 narrows, part of the electrically insulating bonding material 990 projects to above the gas passage member 975 to form the projecting part 940*a*. By adjusting the diameter of the through-hole of the electrically insulating bonding material 990 and the diameter of the gas passage member 975, the degree of contact between the side surface of the gas passage member 975 and the electrically insulating bonding layer 940, the amount of projection of the projecting part 940*a*, the presence or absence of the projecting part 940*a*, and the like. From the viewpoint of ensuring flow of gas in the bonding layer penetrating part 964, the projecting part 940*a* is preferably not present just below the hole 71*a* (part of the hole 71*a* is not closed). As shown in FIG. 22, the projecting part 940*a* is more preferably not present just below the bottom surface of the dense plug 55 (and the coating layer 71).

As shown in FIG. 22, the diameter of the gas passage member 975 is preferably greater than the bottom surface of the dense plug 55 (and the coating layer 71). More specifically, the gas passage member 975 and the dense plug 55 are preferably disposed in such a positional relationship that the bottom surface of the dense plug 55 (and the coating layer 71) is included inside the outline of the top surface of the gas passage member 975 in a top view. With this configuration, the gas passage member 975 is present up to outside beyond the bottom surface of the dense plug 55 (and the coating layer 71) in a top view, so it is easy to establish a state where the side surface of the gas passage member 975 and the electrically insulating bonding layer 940 are in contact with each other and the projecting part 940*a* is not present just below the bottom surface of the dense plug 55 (and the coating layer 71).

In FIG. 22, gas passes through the hole 975*a* of the gas passage member 975; however, gas just needs to pass through the gas passage member 975, and the gas passage member 975 may be, for example, a porous body. In this case, the porosity of the gas passage member 975 may be higher than or equal to 50% and lower than or equal to 80%. The gas passage member 975 may be an elastic body. When, for example, the gas passage member 975 is a metal porous body (porous metal), the gas passage member 975 allows gas to pass and may be a member of an elastic body.

FIG. 22 illustrates that the electrically conductive gas passage part 70 has the gas passage member 975 that provides electrical continuity between the plate spring 972 and the electrically conductive plate 30. Similarly to this, the electrically conductive gas passage part 70 may have a gas passage member that provides electrical continuity between the plate spring 972 and the coating layer 71, and, for example, a positional relationship between the plate spring 972 and the gas passage member 975 in FIG. 22 may be flipped upside down. Alternatively, a gas passage member similar to the gas passage member 975 may be disposed on each side above and below the plate spring 72.

The present application claims priority to International Application No. PCT/JP2024/011681 filed on Mar. 25, 2024, and Japanese Application No. 2024-181488 filed on Oct. 17, 2024, the entire contents of which are incorporated herein by reference.

What is claimed is:

1. A wafer placement table comprising:

a ceramic plate having a wafer placement surface on its top surface and incorporating an electrode;

an electrically conductive plate joined to a bottom surface of the ceramic plate;

a ceramic plate penetrating part extending through the ceramic plate;

an electrically insulating gas passage plug provided at the ceramic plate penetrating part, and allowing gas to pass through the interior;

a gas introduction passage provided at least inside the electrically conductive plate, the gas introduction passage communicating with the ceramic plate penetrating part; and an electrically conductive gas passage part provided in the gas introduction passage, the electrically conductive gas passage part being in contact with a bottom surface of the electrically insulating gas passage plug, the electrically conductive gas passage part being electrically continuous with the electrically conductive plate, the electrically conductive gas passage part allowing gas to pass between the electrically insulating gas passage plug and the gas introduction passage, wherein the electrically conductive gas passage part has a plate spring that presses the electrically insulating gas passage plug upward with elastic force.

2. The wafer placement table according to claim 1, wherein the plate spring is disposed in a state of being extended in a lateral direction perpendicular to an up and down direction by being pressed by the electrically insulating gas passage plug from above.

3. The wafer placement table according to claim 2, wherein the plate spring has a plurality of folded parts folded in the up and down direction.

4. The wafer placement table according to claim 3, wherein the plurality of folded parts includes a first folded part folded from the up direction to the down direction and a second folded part folded from the down direction to the up direction, the first folded part has a first plate-like part that extends in a horizontal direction and of which a top surface makes up a top surface of the plate spring, and the second folded part has a second plate-like part that extends in the horizontal direction and of which a bottom surface makes up a bottom surface of the plate spring.

5. The wafer placement table according to claim 1, wherein the electrically conductive gas passage part has a coating layer that coats the bottom surface of the electrically insulating gas passage plug.

6. The wafer placement table according to claim 1, wherein the electrically insulating gas passage plug is a dense body having a gas internal flow channel, or a porous body.

7. The wafer placement table according to claim 1, wherein the electrically insulating gas passage plug is a dense body having a gas internal flow channel, and an opening of a bottom end of the gas internal flow channel is located outside a moving range of a top surface of the plate spring resulting from a positional shift in the gas introduction passage in a plan view.

8. The wafer placement table according to claim 1, wherein the plate spring has a hole that allows passage of gas.

9. The wafer placement table according to claim 5, further comprising an electric conductor layer that coats a part of the bottom surface of the ceramic plate, exposed to the gas introduction passage, wherein the plate spring is in contact with the electric conductor layer.

10. The wafer placement table according to claim 5, further comprising an electric conductor layer that coats a part of the bottom surface of the ceramic plate, exposed to an inside of the gas introduction passage, and an electrically conductive conduction member that is in contact with each of the electrically conductive plate and the electric conductor layer.

11. The wafer placement table according to claim 10, wherein the conduction member is an elastic body that presses the electric conductor layer upward with elastic force.

12. The wafer placement table according to claim 1, wherein the electrically conductive gas passage part has a gas passage member that provides continuity between the electrically conductive plate and the plate spring.

13. The wafer placement table according to claim 12, wherein the gas passage member is an elastic body.

* * * * *